(12) United States Patent
Tsuchiya et al.

(10) Patent No.: US 10,227,518 B2
(45) Date of Patent: Mar. 12, 2019

(54) POLISHING COMPOSITION AND METHOD FOR PRODUCING SAME

(71) Applicant: FUJIMI INCORPORATED, Kiyosu-shi, Aichi (JP)

(72) Inventors: Kohsuke Tsuchiya, Kiyosu (JP); Yoshio Mori, Kiyosu (JP)

(73) Assignee: FUJIMI INCORPORATED, Kiyosu-shi, Aichi (JP)

( * ) Notice: Subject to any disclaimer, the term of this patent is extended or adjusted under 35 U.S.C. 154(b) by 195 days.

(21) Appl. No.: 14/917,734

(22) PCT Filed: Sep. 22, 2014

(86) PCT No.: PCT/JP2014/075123
§ 371 (c)(1),
(2) Date: Mar. 9, 2016

(87) PCT Pub. No.: WO2015/046163
PCT Pub. Date: Apr. 2, 2015

(65) Prior Publication Data
US 2016/0215189 A1 Jul. 28, 2016

(30) Foreign Application Priority Data
Sep. 30, 2013 (JP) .................................. 2013-204466

(51) Int. Cl.
C09K 3/14 (2006.01)
C09G 1/04 (2006.01)
C09G 1/02 (2006.01)
B24B 37/00 (2012.01)
B24B 37/04 (2012.01)
H01L 21/02 (2006.01)

(52) U.S. Cl.
CPC ............ C09K 3/1463 (2013.01); B24B 37/00 (2013.01); B24B 37/044 (2013.01); C09G 1/02 (2013.01); C09G 1/04 (2013.01); C09K 3/1436 (2013.01); H01L 21/02024 (2013.01); H01L 21/02052 (2013.01)

(58) Field of Classification Search
None
See application file for complete search history.

(56) References Cited

U.S. PATENT DOCUMENTS

| | | | | |
|---|---|---|---|---|
| 5,349,023 A * | 9/1994 | Ikeda | ......................... | C08F 8/32 525/330.5 |
| 7,767,784 B2 * | 8/2010 | Kozlowski | ........... | C08G 65/329 528/272 |
| 7,872,082 B2 * | 1/2011 | Kozlowski | ......... | C07D 207/452 525/55 |
| 2004/0052746 A1 * | 3/2004 | Tamareselvy | ........ | A61K 8/8158 424/70.11 |
| 2004/0241130 A1 * | 12/2004 | Tamareselvy | ............ | A61K 8/04 424/70.16 |
| 2006/0010781 A1 | 1/2006 | Ikeda et al. | | |
| 2007/0218811 A1 | 9/2007 | Kurata et al. | | |
| 2008/0003925 A1 * | 1/2008 | Fukasawa | ................. | C09G 1/02 451/37 |
| 2008/0064851 A1 * | 3/2008 | Kozlowski | ........... | C08G 65/329 528/422 |
| 2008/0233069 A1 * | 9/2008 | Tamareselvy | ........ | A61K 8/8158 424/70.11 |
| 2008/0254717 A1 * | 10/2008 | Fukasawa | ................. | C09G 1/02 451/36 |
| 2010/0081281 A1 | 4/2010 | Babu et al. | | |
| 2010/0323452 A1 * | 12/2010 | Monthony | ........... | B01D 15/361 436/85 |
| 2011/0059680 A1 * | 3/2011 | Motonari | .................. | C09G 1/02 451/36 |
| 2011/0240594 A1 | 10/2011 | Hamaguchi et al. | | |
| 2011/0288229 A1 * | 11/2011 | Vieari | ................... | C08F 218/08 524/547 |
| 2013/0017744 A1 * | 1/2013 | Nakamura | ............ | C08F 261/04 442/59 |

FOREIGN PATENT DOCUMENTS

| | | |
|---|---|---|
| CN | 1721494 A | 1/2006 |
| CN | 101023512 A | 8/2007 |
| CN | 101032001 A | 9/2007 |
| CN | 101311205 A | 11/2008 |
| JP | 2000-345145 A | 12/2000 |
| JP | 2001-240850 A | 9/2001 |
| JP | 2003-303791 A | 10/2003 |
| JP | 2008-147688 A | 6/2008 |
| JP | 2009-070904 A | 4/2009 |
| JP | 2009070904 A * | 4/2009 |
| JP | 2010-016344 A | 1/2010 |
| JP | 2010-199595 A | 9/2010 |
| JP | 2011-103498 A | 5/2011 |
| TW | 200944582 A1 | 11/2009 |

* cited by examiner

Primary Examiner — Colleen P Dunn
Assistant Examiner — Ross J Christie
(74) Attorney, Agent, or Firm — Foley & Lardner LLP; Benjamin A. Berkowitz

(57) ABSTRACT

Provided is a polishing composition with which surface defects can be efficiently reduced. This invention provides a polishing composition comprising a water-soluble polymer $M_{C-end}$. The main chain of the water-soluble polymer $M_{C-end}$ is formed with a non-cationic region as its main structural part and a cationic region located at least at one end of the main chain. The cationic region has at least one cationic group.

20 Claims, No Drawings

POLISHING COMPOSITION AND METHOD FOR PRODUCING SAME

TECHNICAL FIELD

The present invention relates to a polishing composition. In particular, it relates to a polishing composition used primarily for polishing semiconductor substrates such as silicon wafers and other polishing objects. The present application claims priority to Japanese Patent Application No. 2013-204466 filed on Sep. 30, 2013, and the entire contents thereof are incorporated herein by reference.

BACKGROUND ART

Heretofore, precision polishing has been performed using a polishing liquid on surfaces of materials such as metals, metalloids, non-metals and their oxides. For instance, the surface of a silicon wafer used as a component of a semiconductor product, etc., is generally polished to a high quality mirror finish via a lapping step (rough polishing step) and a polishing step (precision polishing step). The polishing step typically comprises a first polishing step and a final polishing step. Patent Documents 1 and 2 are cited as technical literatures related to polishing compositions used primarily for polishing semiconductor substrates such as silicon wafers, etc.

CITATION LIST

Patent Literature

[Patent Document 1] Japanese Patent Application Publication No. 2000-345145
[Patent Document 2] Japanese Patent Application Publication No. 2001-240850

SUMMARY OF INVENTION

Technical Problem

Many polishing compositions for polishing (especially precision polishing) of semiconductor substrates such as silicon wafers and other substrates include water-soluble polymers for protecting surfaces of polishing objects and for increasing their wettability, etc. An example of such water-soluble polymer is hydroxyethyl cellulose (HEC). HEC is a polymer derived from a natural compound (cellulose). Thus, the level of control is limited for its chemical structure and purity as compared to polymers (or synthetic polymers, hereinafter) obtained by artificially polymerizing monomers. On the other hand, synthetic polymers are advantageous in that as compared to naturally-derived polymers such as HEC, their structural control is relatively easy including adjustment of their weight average molecular weights and molecular weight distribution (ratio of weight average molecular weight (Mw) to number average molecular weight (Mn)), allowing a great degree of reduction of foreign substances and local disorder (micro-scale aggregation, etc.) that may cause surface defects. However, from the standpoint of the practicality, currently, it is still difficult to obtain a synthetic polymer that works as well as or better than HEC. As growing demands are expected for the quality of polished surfaces in the future, it is useful to provide a polishing composition with which surface defects can be efficiently reduced.

The present invention has been made in view of the circumstances described above. An objective thereof is to provide a polishing composition with which surface defects can be efficiently reduced.

Solution to Problem

This invention provides a polishing composition comprising a water-soluble polymer $M_{C\text{-}end}$. The main chain of the water-soluble polymer $M_{C\text{-}end}$ is formed with a non-cationic region as its main structural part and a cationic region located at least at one end of the main chain. The cationic region has at least one cationic group. Such a structure allows efficient reduction of surface defects when the polymer $M_{C\text{-}end}$ and an abrasive having an anionic surface are present together. The cationic region is preferably present only at the one end of the main chain. The cationic group is preferably an amino group. The cationic group is preferably present at a terminus of the main chain.

In a preferable embodiment of the art disclosed herein, the main chain is formed with carbon-carbon bonds. A polymer $M_{C\text{-}end}$ having a main chain in such a structure is excellent in protecting a polishing object having a hydrophobic surface.

In a preferable embodiment of the art disclosed herein, the polishing composition has a pH in a range of 8 to 12. The pH can be preferably applied to a polishing liquid used for polishing a polishing object such as a silicon wafer.

In a preferable embodiment of the art disclosed herein, the water-soluble polymer $M_{C\text{-}end}$ is a vinyl alcohol-based polymer. According to a polishing composition comprising a vinyl alcohol-based polymer as the polymer $M_{C\text{-}end}$, the effect to reduce surface defects can be produced to a greater extent.

In a preferable embodiment of the art disclosed herein, the polishing composition further comprises a water-soluble polymer $M_{A\text{-}end}$ in addition to the water-soluble polymer $M_{C\text{-}end}$. The main chain of the water-soluble polymer $M_{A\text{-}end}$ is formed with a non-anionic region as its main structural part and an anionic region located at least at one end of the main chain. The anionic region has at least one anionic group. Such a structure can further reduce surface defects. A composition comprising the water-soluble polymer $M_{A\text{-}end}$ may show greater dispersion stability.

In a preferable embodiment of the art disclosed herein, the polishing composition further comprises a water-soluble polymer $M_{L\text{-}end}$ in addition to the water-soluble polymer $M_{C\text{-}end}$. The water-soluble polymer $M_{L\text{-}end}$ has a hydrophobic region at least at one end of its main chain. The hydrophobic region has at least one hydrophobic group derived from a polymerization initiator. Such a structure can further reduce surface defects when the polishing object has a hydrophobic surface. The composition comprising the water-soluble polymer ML brings about reduction of haze.

In a preferable embodiment of the art disclosed herein, the polishing composition further comprises an abrasive. The use of the polishing composition comprising the polymer $M_{C\text{-}end}$ and abrasive can increase the polishing rate by the mechanical work of the abrasive and efficiently reduce surface defects.

The polishing composition disclosed herein can be preferably used for polishing silicon wafers. A polishing composition comprising the polymer $M_{C\text{-}end}$ may bring about a higher-quality silicon wafer surface. The polishing composition can be preferably applied to, for instance, polishing a lapped silicon wafer. Final polishing is cited as an example of a particularly preferable application object.

The present invention also provides a method for producing a polishing composition. The production method is characterized by preparing a polishing composition that comprises a water-soluble polymer $M_{C\text{-}end}$ having a main chain formed with a non-cationic region as its main structural part and a cationic region, wherein the cationic region is located at least at one end of the main chain and has at least one cationic group. Such a production method provides a polishing composition with which surface defects can be efficiently reduced. In a preferable embodiment of the art disclosed herein, the polishing composition may further comprise an abrasive, a basic compound and water. The production method preferably includes obtaining a dispersion that comprises the abrasive, basic compound and water; obtaining an aqueous solution comprising the water-soluble polymer $M_{C\text{-}end}$ and water; and adding and mixing the aqueous solution with the dispersion.

This invention also provides a method for producing a polished object, using a polishing composition disclosed herein. The method includes obtaining a polishing liquid that comprises the polishing composition; supplying the polishing liquid to a polishing object; and polishing a surface of the polishing object with the polishing liquid. Such a production method can produce a polished object having a high-quality surface with few defects.

DESCRIPTION OF EMBODIMENTS

Preferred embodiments of the present invention are described below. Matters necessary to implement this invention other than those specifically referred to in this description may be understood as design matters to a person of ordinary skill in the art based on the conventional art in the pertinent field. The present invention can be implemented based on the contents disclosed in this description and common technical knowledge in the subject field.

<Water-Soluble Polymer $M_{C\text{-}end}$>

The polishing composition disclosed herein is characterized by comprising a water-soluble polymer $M_{C\text{-}end}$ (or simply a polymer $M_{C\text{-}end}$, hereinafter). In the polymer $M_{C\text{-}end}$, the main chain is formed with a non-cationic region as its main structural part and a cationic region located at least at one end of the main chain. From the standpoint of highly controlling the structure and properties such as the molecular weight distribution, the polymer $M_{C\text{-}end}$ is preferably a synthetic polymer prepared typically by a polymerization method.

In this description, the main chain of a water-soluble polymer refers to the chain structure forming the polymer's backbone. Such a chain structure is formed typically with covalent bonds. When the polymer has two or more molecular chains (typically, each a structural group extending in a linear or branched fashion between terminal groups or branching points), the main chain is the predominant molecular chain relative to which the other chain(s) can be considered pendant(s). In a synthetic polymer, the main chain is generally the most basic polymer chain. For instance, in a graft polymer, regardless of its length, any molecular chain having a structure (e.g. a block structure) different from the main chain (that is, typically a molecular chain derived from a different monomer from the main chain) can be defined as a side chain.

In this description, the main structural part of a water-soluble polymer's main chain refers to the basic part of the water-soluble polymer's main chain. For instance, when the main chain is divided into three equal parts, it may be defined as a part that exhibits the same properties (e.g. ionicity, hydrophilicity/hydrophobicity) as the central part. In the polymer $M_{C\text{-}end}$, the region other than the terminally located cationic region—i.e. the non-cationic region—is defined as its main structural part. The same applies to the non anionicregion in the polymer $M_{A\text{-}end}$ and the hydrophilic region in the polymer $M_{L\text{-}end}$ described later. The ratio (molar ratio) of the number of moles of the main structural part in the number of moles of repeat units of the entire water-soluble polymer's main chain (in the number of moles of units derived from polymerizable monomers in case of a synthetic polymer) is usually greater than 50% and suitably 75% or greater (e.g. 90% or greater, typically 95% or greater). The ratio of the number of moles of the main structural part can be 99% or greater.

In the main chain of the polymer $M_{C\text{-}end}$, the non-cationic region forming the main structural part is a region that exhibits, as a whole, different ionicity from cationicity, that is, non-cationicity. In other words, as the whole region, it is an anionic or nonionic region. From the standpoint of the protection of the polishing object, etc., the non-cationic region is preferably a region exhibiting nonionicity (i.e. a nonionic region). From the standpoint of the composition's dispersion stability, washability, etc., the non-cationic region is preferably a region exhibiting anionicity (i.e. an anionic region). The non-cationic region is formed with anionic or nonionic repeat units and is preferably essentially free of a cationic repeat unit. Herein, being essentially free of a cationic repeat unit means that in this region, the molar ratio of the cationic repeat unit is below 0.01% (e.g. below 0.001%). In this description, the ionicity (cationicity, anionicity or nonionicity) refers to the ionicity in the polishing composition unless otherwise indicated. For instance, when the polishing composition has a pH of 8 to 12, the ionicity of the region at pH 8 to 12 is considered. The same applies to the hydrophilicity/hydrophobicity described later.

The non-cationic region may comprise at least one species of functional group selected from anionic groups and nonionic groups. From the standpoint of reducing surface defects, it is preferable that the non-cationic region is essentially free of a cationic group. The non-cationic region may have, for instance, an amide structure, heterocyclic structure, vinyl structure (including a structure formed with vinyl group-derived carbon-carbon bonds (—C—C—); the same applies, hereinafter), polyoxyalkylene structure and so on. Especially, a non-cationic region having a vinyl structure in the main chain backbone is preferable in view of the attractive properties relative to substrate surfaces and also in industrial aspects. Examples of the polymer having a non-cationic region include a polyvinyl alcohol, a polymer comprising vinyl alcohol (VA) units, a polyacryloylmorpholine, polyacrylic acid and the like.

From the standpoint of the hydrophilicity and dispersibility, the non-cationic region is preferably a vinyl alcohol-based region in which the molar ratio of the VA unit as a repeat unit in the number of moles of all repeat units in the region is 50% or higher. The ratio of the number of moles of the VA unit in the number of moles of all repeat units in the region is more preferably 70% or higher, or yet more preferably 80% or higher (e.g. 90% or higher, typically 95% or higher). All the repeat units in the non-cationic region may consist essentially of VA units. The polymer $M_{C\text{-}end}$ having a non-cationic region as described above may preferably be a vinyl alcohol-based polymer.

In another preferable embodiment, from the standpoint of reducing surface defects, the non-cationic region is a region (an acryloylmorpholine-based region) in which the molar ratio of the acryloylmorpholine (ACMO) unit as a repeat unit in the number of moles of all repeat units in the region is 50% or higher. The ratio of the number of moles of the ACMO unit in the number of moles of all repeat units in the region is more preferably 70% or higher, or yet more preferably 80% or higher (e.g. 90% or higher, typically 95% or higher). All the repeat units in the non-cationic region may consist essentially of ACMO units. The polymer $M_{C\text{-}end}$ having a non-cationic region as described above may preferably be an acryloylmorpholine-based polymer.

The cationic region present in the main chain of the polymer $M_{C\text{-}end}$ is a region that exhibits cationicity as a whole and is located at least at one end of the main chain. In this description, an end of a main chain refers to a segment that includes a terminus of the main chain. Accordingly, a region located at one end of the main chain can be considered a region over a certain range extending at least from the one terminus of the main chain in the direction towards the center of the main chain. The polymer $M_{C\text{-}end}$ disclosed herein has a cationic region at an end of its main chain, thereby being able to reduce surface defects when the polymer $M_{C\text{-}end}$ is present with an abrasive having an anionic surface (e.g. a silica abrasive in a basic atmosphere). A reason for this can be, but not particularly limited to, for instance, the following: It is thought that when the polymer $M_{C\text{-}end}$ is present with an abrasive having an anionic surface, the end of the main chain of the polymer $M_{C\text{-}end}$ is attracted to the abrasive's anionic surface, whereby the polymer $M_{C\text{-}end}$ is attracted only by the end to the abrasive's surface. Such a unique state of attraction is thought to favorably protect the abrasive's surface, thereby bringing about the effect to reduce surface defects (e.g. scratches and PID (polishing induced defect)) while producing a practical polishing rate.

The cationic region is preferably present only at one end of the polymer $M_{C\text{-}end}$'s main chain. This can further reduce surface defects. When the polymer $M_{C\text{-}end}$ is present with an abrasive having an anionic surface, the polymer $M_{C\text{-}end}$ having the aforementioned structure is thought to be attracted only at the particular end to the abrasive and suitably separated from the abrasive at the other end. It is thought that this state inhibits aggregation of the abrasive via the water-soluble polymer; and therefore, surface defects caused by the aggregation can be reduced.

The cationic region disclosed herein has at least one cationic group. The maximum number of cationic groups in the cationic region is not particularly limited. From the standpoint of the dispersion stability of the composition, it is suitably about 50 or below (e.g. 10 or below, typically 5 or below). The number of cationic groups in the cationic region is preferably one or two. As the cationic group, an organic cationic group is preferable. Examples include cationic groups derived from amino groups (including derivatives of primary and secondary amines), imine groups, amidino groups, imidazolino groups, etc. Typical examples include amino groups, imine groups, amidino groups, imidazolino groups and the like that are neutralized and cationized with internal (intramolecular) acids, such as ammonium, um, amidino, imidazolium salts, etc. The cationic group may be in a quaternary ammonium form. In particular, an amino group neutralized and cationized with an internal (intramolecular) acid is preferable. The art disclosed herein can be implemented particularly preferably in an embodiment comprising a polymer $M_{C\text{-}end}$ in which a cationic region having an amino group is placed at an end of the main chain having a vinyl alcohol-based region as the non-cationic region.

The cationic region can also be formed with cationic repeat units. It is preferable that this region is essentially free of anionic and nonionic repeat units. Herein, being essentially free of anionic and nonionic repeat units means that the molar ratio of anionic and nonionic repeat units in this region is below 0.01% (e.g. below 0.001%).

The cationic group is preferably present at a terminus of the main chain of the polymer $M_{C\text{-}end}$. By this, when the polymer $M_{C\text{-}end}$ is present with an abrasive having an anionic surface, the polymer $M_{C\text{-}end}$ arranges itself to suitably protect the abrasive's surface and preferably reduce surface defects caused by the abrasive. From the standpoint of combining protection from and dispersibility of the abrasive, the cationic group is preferably present only at a terminus of the main chain of the polymer $M_{C\text{-}end}$ and more preferably only at one terminus of the main chain. In this case, for instance, a single cationic group may happen to be present in the cationic region, yet such a structure can also bring about an excellent effect to reduce surface defects. In general, while the overall nature of a water-soluble polymer is determined on the whole of its repeat units, its termini are highly mobile. Thus, the chemical structure and conformation of the termini have significant impact on the polymer's behavior, particularly its dissociative/associative reaction behavior. The art disclosed herein is made to contribute to reduction of surface defects, taking advantage of the nature of the termini.

The ratio of the number of moles of the cationic region in the number of moles of repeat units in the entire main chain of the polymer $M_{C\text{-}end}$ is usually below 50% and suitably 25% or below (e.g. 10% or below, typically 5% or below). The ratio of the number of moles of the cationic region can be 1% or below.

The method for introducing the cationic region is not particularly limited. For instance, by using a cationic group-containing polymerization initiator in preparing the polymer $M_{C\text{-}end}$, a cationic region can be introduced into an end of the main chain of the polymer $M_{C\text{-}end}$. Alternatively, when preparing the polymer $M_{C\text{-}end}$, a cationic region can be introduced by using a cationic group-containing chain transfer agent or a cationic group-containing polymerization terminator. A structure having a cationic region at an end of the main chain can be obtained by preparing a block copolymer formed with a cationic group-containing repeat unit block (typically a block formed with a cationic region (a cationic block)) and a block (non-cationic block) formed with a non-cationic region by a known polymerization method. In particular, it is preferable to introduce the cationic region by using a polymerization initiator having a cationic group since it can introduce the cationic group into a terminus of the main chain. In this case, the cationic group is derived from the polymerization initiator. An example of the cationic group-containing polymerization initiator is a polymerization initiator having an organic cationic group such as an amino group. The polymerization initiator is preferably an azo-based initiator. Specific examples thereof include 2,2'-azobis(2-amidinopropane) (V-50), 2,2'-azobis(2-(2-imidazoline-2-yl)propane) hydrochloride, and the like in accordance with applicable half-life temperatures. In an example of the method using a chain transfer agent, after radical polymerization is carried out in the presence of an amino group-containing thiol such as aminoethanethiol, a terminus of the chain is cationized with hydrochloric acid, etc. In this case, aminoethanethiol can be neutralized in advance with hydrochloric acid, etc. In this embodiment, the cationic group is derived from the chain transfer agent.

When the polymer $M_{C\text{-}end}$ has one or more side chains besides the main chain, these side chains may also be non-cationic. For instance, the side chains may exhibit the same ionicity as the non-cationic region in the main chain The polymer $M_{C\text{-}end}$ disclosed herein may be non-cationic except the cationic region located at least at one end (preferably only at one end) of the main chain. Accordingly, the polymer $M_{C\text{-}end}$ disclosed herein may be formed with a cationic region located at least at one end (preferably only at one end) of the main chain and a non-cationic region.

The type of the polymer $M_{C\text{-}end}$ is not particularly limited. For instance, among the water-soluble polymers listed later as examples, a species that can serve as the polymer $M_{C\text{-}end}$ (typically a water-soluble polymer having a non-cationic region in the main chain) can be preferably used. For the polymer $M_{C\text{-}end}$, solely one species or a combination of two or more species can be used. In particular, a vinyl alcohol-based polymer is more preferable. For instance, as the polymer $M_{C\text{-}end}$, a vinyl alcohol-based polymer having a cationic region at an end of the main chain can be preferably used. As the polymer $M_{C\text{-}end}$, a vinyl alcohol-based polymer having a cationic group (e.g. an amino group) at a terminus of the main chain is particularly preferable.

Alternatively, an acryloylmorpholine-based polymer can be preferably used as the polymer $M_{C\text{-}end}$. A specific example of the polymer $M_{C\text{-}end}$ according to a preferable embodiment is an acryloylmorpholine-based polymer having a cationic group (e.g. an amino group) at a terminus of the main chain.

In the art disclosed herein, the polymer $M_{C\text{-}end}$ content in the total amount of the water-soluble polymer in the polishing composition is not particularly limited. From the standpoint of obtaining the effect of the polymer $M_{C\text{-}end}$ to a greater extent, the polymer $M_{C\text{-}end}$ content in the total amount of the water-soluble polymer is suitably 10% by weight or greater (e.g. 30% by weight or greater, typically 50% by weight or greater). For a similar reason, the polymer $M_{C\text{-}end}$ content is preferably 70% by weight or greater (e.g. 90% by weight or greater, typically 95% by weight or greater). The water-soluble polymer may essentially consist of the polymer $M_{C\text{-}end}$. The upper limit of polymer $M_{C\text{-}end}$ content in the total amount of the water-soluble polymer in the polishing composition is not particularly limited. From the standpoint of obtaining the effect of its use in combination with other water-soluble polymer(s), the polymer $M_{C\text{-}end}$ content in the total amount of the water-soluble polymer can be 90% by weight or less (e.g. 70% by weight or less, typically 50% by weight or less).

<Water-Soluble Polymer $M_{A\text{-}end}$>

It is preferable that the polishing composition disclosed herein further comprises a water-soluble polymer $M_{A\text{-}end}$ (or simply a polymer $M_{A\text{-}end}$ hereinafter) in addition to the polymer $M_{A\text{-}end}$. The main chain of the polymer $M_{A\text{-}end}$ is formed with a non-anionic region as its main structural part and an anionic region located at least at one end of the main chain. For a similar reason as for the polymer $M_{C\text{-}end}$, the polymer $M_{A\text{-}end}$ is preferably a synthetic polymer prepared by a polymerization method.

In the main chain of the polymer $M_{A\text{-}end}$, the non-anionic region forming the main structural part refers to a region that exhibits, as a whole, different ionicity from anionicity, that is, non-anionicity. In other words, it is overall a cationic or nonionic region. From the standpoint of the protection of the polishing object, etc., the non-anionic region is preferably a region exhibiting nonionicity (i.e. a nonionic region). From the standpoint of attraction to the abrasive, the non-anionic region is preferably a region exhibiting cationicity (i.e. a cationic region). The non-anionic region is preferably formed with cationic and nonionic repeat units, but essentially free of an anionic repeat unit. Herein, being essentially free of an anionic repeat unit means that in this region, the molar ratio of the anionic repeat unit is below 0.01% (e.g. below 0.001%).

The non-ionic region may comprise at least one species of functional group selected from cationic groups and nonionic groups. From the standpoint of reducing surface defects, the non-anionic region is preferably essentially free of an anionic group. It is more preferably a nonionic region. The non-anionic region may have, for instance, an amide structure, quaternary nitrogen structure, heterocyclic structure, vinyl structure, polyoxyalkylene structure, etc. Especially, a non-anionic region having a vinyl structure in its main chain backbone is preferable in view of the attractive properties relative to substrate surfaces and also in industrial aspects. Examples of the polymer having a non-anionic region include a polyvinyl alcohol, a polymer comprising VA units, polyacryloylmorpholine, polyacrylic acid, polyvinylpyrrolidone, polyacrylonitrile and the like.

From the standpoint of the hydrophilicity and dispersibility, the non-anionic region is preferably a vinyl alcohol-based region in which the molar ratio of the VA unit as a repeat unit in the number of moles of all repeat units in the region is 50% or higher. The ratio of the number of moles of the VA unit in the number of moles of all repeat units in the region is more preferably 70% or higher, or yet more preferably 80% or higher (e.g. 90% or higher, typically 95% or higher). All the repeat units in the non-anionic region may consist essentially of VA units. A polymer $M_{A\text{-}end}$ having a non-anionic region as described above may preferably be a vinyl alcohol-based polymer.

Alternatively, from the standpoint of reducing surface defects, the non-anionic region may be a region in which the molar ratio of the acryloylmorpholine (ACMO) unit and/or vinylpyrrolidone (VP) unit as repeat units in the number of moles of all repeat units in the region is 50% or higher. For instance, it is preferably an acryloylmorpholine-based region in which the molar ratio of the ACMO unit as a repeat unit in the number of moles of all repeat units in the region is 50% or higher. Alternatively, it is preferably a vinylpyrrolidone-based region in which the molar ratio of the VP unit as a repeat unit in the number of moles of all repeat units in the region is 50% or higher. The ratio of the number of moles of the ACMO unit and/or VP unit in the number of moles of all repeat units in the region is more preferably 70% or higher, or yet more preferably 80% or higher (e.g. 90% or higher, typically 95% or higher). All the repeat units in the non-anionic region may essentially consist of ACMO units and/or VP units. The polymer $M_{A\text{-}end}$ end having a non-anionic region as described above may preferably be an acryloylmorpholine-based polymer or a vinylpyrrolidone-based polymer.

The anionic region present in the main chain of the polymer $M_{A\text{-}end}$ is a region that exhibits anionicity as a whole and is located at least at one end of the main chain. The polymer $M_{A\text{-}end}$ disclosed herein has an anionic region at an end of its main chain, thereby being able to reduce surface defects when the polymer $M_{A\text{-}end}$ is present with an abrasive having an anionic surface. A reason for this can be the following: When the polymer $M_{A\text{-}end}$ is present with an abrasive having an anionic surface, the end of the main chain of the polymer $M_{A\text{-}end}$ repels the abrasive's anionic surface to inhibit aggregation of the abrasive; and therefore, in the polishing composition, a well-dispersed state is achieved. The well-dispersed state (initial dispersibility) further contributes to increase the washability after polishing and inhibit abrasive-derived aggregates from remaining after cleaning. As a result, it may bring about the effect to reduce surface defects (e.g. PID). The $M_{A\text{-}end}$ being not associated with the abrasive will bring about increased protection of substrate surfaces during polishing, whereby haze reduction can be expected. As described above, the polymer $M_{A\text{-}end}$ contributes to reduction of surface defects by a different mechanism from the polymer $M_{C\text{-}end}$. Thus, the combined use of the polymers $M_{C\text{-}end}$ and $M_{A\text{-}end}$ can reduce surface defects to a greater extent.

The anionic region is preferably present only at one end of the main chain of the polymer $M_{A\text{-}end}$. For instance, when the polymer $M_{A\text{-}end}$ is present with an abrasive having an anionic surface and the non-anionic region of the polymer $M_{A\text{-}end}$ is cationic, the polymer $M_{A\text{-}end}$ is likely to be attracted to the abrasive and aggregates are likely to be formed from the abrasive. However, with the anionic region being present only at one end of the main chain of the polymer $M_{A\text{-}end}$, the polymer $M_{A\text{-}end}$ stays off the abrasive at the particular end. This brings about great dispersibility and increased washability. Such a state further contributes to reduction of surface defects.

The anionic region disclosed herein has at least one anionic group. The maximum number of anionic groups in the anionic region is not particularly limited. From the standpoint of obtaining good attraction to the abrasive, it is suitably about 50 or below (e.g. 10 or below, typically 5 or below). The number of anionic groups in the anionic region is preferably one or two. As the anionic group, an organic anionic group is preferable. Examples include anionic groups derived from carboxyl group, hydroxyl group, sulfo group, sulfuric acid group, phosphoric acid group, phosphonic acid group, etc. Typical examples are conjugate bases of carboxyl group, hydroxyl group, sulfo group, sulfuric acid group, phosphoric acid group, phosphonic acid group, etc. In particular, the conjugate base(s) of carboxyl group and/or hydroxyl group is preferable and the conjugate base of carboxyl group is more preferable. The art disclosed herein can be particularly preferably implemented in an embodiment comprising a polymer $M_{A\text{-}end}$ in which a carboxyl group-containing anionic region is placed at an end of its main chain having a vinyl alcohol-based region as the non-anionic region.

The anionic region may be a region formed with anionic repeat units. This region is preferably essentially free of cationic and nonionic repeat units. Herein, being essentially free of cationic and nonionic repeat units means that the molar ratio of cationic and nonionic repeat units in the region is below 0.01% (e.g. below 0.001%).

The anionic group is preferably present at a terminus of the main chain of the polymer $M_{A\text{-}end}$. By this, when the polymer $M_{A\text{-}end}$ is present with an abrasive having an anionic surface, the terminus of the main chain of the polymer $M_{A\text{-}end}$ repels and stays off the abrasive having the anionic surface, bringing about a well-dispersed state. From the standpoint of combining surface protection and dispersibility of the abrasive, the anionic group is preferably present only at a terminus of the main chain of the polymer $M_{A\text{-}end}$ and more preferably only at one terminus of the main chain. In this case, for instance, a single anionic group may happen to be present in the anionic region, yet such a structure can also bring about great dispersion and an excellent effect to reduce surface defects.

The ratio of the number of moles of the anionic region in the number of moles of repeat units in the entire main chain of the polymer $M_{A\text{-}end}$ is usually below 50% and suitably 25% or below (e.g. 10% or below, typically 5% or below). The ratio of the number of moles of the anionic region can even be 1% or below.

The method for introducing the anionic region is not particularly limited. For instance, by preparing the polymer $M_{A\text{-}end}$ by using a polymerization initiator having an anionic group, the anionic region can be introduced into an end of the main chain of the polymer $M_{A\text{-}end}$. Alternatively, in preparing the polymer $M_{A\text{-}end}$, the anionic region can be introduced by the use of a chain transfer agent having an anionic group or a polymerization terminator having an anionic group. A structure having an anionic region at an end of the main chain can be obtained by preparing a block copolymer formed with an anionic group-containing repeat unit block (typically a block formed with an anionic region (an anionic block)) and a block (non-anionic block) formed with a non-anionic region by a known polymerization method. In particular, it is preferable to introduce the anionic region by using a polymerization initiator having an anionic group since it can introduce the anionic group into a terminus of the main chain. In this case, the anionic group is derived from the polymerization initiator. An example of the anionic group-containing polymerization initiator is a polymerization initiator having an organic anionic group such as carboxyl group. The polymerization initiator is preferably an azo-based initiator. Specific examples thereof include 4,4'-azobis(4-cyanopentanoic acid) (ACOA), 2,2'-azobis(isobutyric acid), 2,2'-azobis(2-methylpentanoic acid), etc. In an example of the method using a chain transfer agent, radical polymerization is carried out in the presence of a carboxyl group-containing thiol such as mercaptopropionic acid to introduce an anionic group into one terminus of the polymer. In this case, the carboxyl group can be neutralized in advance with potassium hydroxide, etc. In this embodiment, the anionic group is derived from the chain transfer agent.

When the polymer $M_{A\text{-}end}$ has one or more side chains besides the main chain, these side chains may also be non-anionic. For instance, the side chains may exhibit the same ionicity as the non-anionic region in the main chain. The polymer $M_{A\text{-}end}$ disclosed herein is non-anionic except at the anionic region located at least at one end (preferably only at one end) of the main chain. Accordingly, the polymer $M_{A\text{-}end}$ disclosed herein may consist of an anionic region located at least at one end (preferably only at one end) of the main chain and a non-anionic region.

The type of the polymer $M_{A\text{-}end}$ is not particularly limited. For instance, among the water-soluble polymers listed later as examples, a species that can serve as the polymer $M_{A\text{-}end}$ (typically a water-soluble polymer having a non-anionic region in the main chain) can be preferably used. For the polymer $M_{A\text{-}end}$, solely one species or a combination of two or more species can be used. In particular, a vinyl alcohol-based polymer, acryloylmorpholine-based polymer and vinylpyrrolidone-based polymer are more preferable; a vinyl alcohol-based polymer and acryloylmorpholine-based polymer are even more preferable; and a vinyl alcohol-based polymer is particularly preferable. For instance, as the polymer $M_{A\text{-}end}$, an acryloylmorpholine-based polymer having an anionic region at an end of the main chain can be preferably used. A specific example of the polymer $M_{A\text{-}end}$ according to a preferable embodiment is a vinyl alcohol-based polymer having an anionic group (e.g. carboxyl group) at a terminus of the main chain.

When using the polymer $M_{A\text{-}end}$, there are no particular limitations to the usage ratio of polymer $M_{C\text{-}end}$ to polymer $M_{A\text{-}end}$ (which can be thought as their content ratio in the polishing composition). From the standpoint of producing the effect of the combined use of the polymers $M_{C\text{-}end}$ and $M_{A\text{-}end}$ to a greater extent, their usage ratio ($M_{C\text{-}end}$:$M_{A\text{-}end}$) is suitably 5:95 to 95:5 or preferably 10:90 to 90:10 (e.g. 20:80 to 80:20) by weight.

<Water-Soluble Polymer $M_{L\text{-}end}$>

It is preferable that the polishing composition disclosed herein further comprises a water-soluble polymer $M_{L\text{-}end}$ (or simply a polymer $M_{L\text{-}end}$ hereinafter) in addition to the polymer $M_{C\text{-}end}$. The polymer $M_{L\text{-}end}$ has a hydrophobic region at least at one end of its main chain. For a similar reason as for the polymer $M_{C\text{-}end}$, the polymer $M_{L\text{-}end}$ may typically be a synthetic polymer prepared by a polymerization method.

The main chain of the polymer $M_{L\text{-}end}$ should just have a hydrophobic region at least at one end thereof. For instance, it can be either a water-soluble polymer having in the main chain a main structural part formed with a hydrophobic region and a hydrophilic region or a water-soluble polymer having in the main chain a main structural part formed with a hydrophilic region.

The main chain of the polymer $M_{L\text{-}end}$ is preferably formed with a hydrophilic region as its main structural part and a hydrophobic region located at least at one end of the main chain. Herein, the hydrophilic region refers to a region that exhibits hydrophilicity as a whole. The hydrophilic region is formed with hydrophilic repeat units (hydrophilic units) and is preferably essentially free of a hydrophobic repeat unit (hydrophobic unit). Herein, being essentially free of a hydrophobic repeat unit means that the molar ratio of the hydrophobic repeat unit is below 0.01% (e.g. below 0.001%). Alternatively, the hydrophilic region may comprise a hydrophilic unit and a hydrophobic unit.

From the standpoint of the water solubility, etc., in the hydrophilic region, the molar ratio of the hydrophilic unit as a repeat unit in the number of moles of all repeat units in the region is preferably above 50%. The ratio (molar ratio) of the number of moles of the hydrophilic unit in the number of moles of all repeat units in the region is more preferably 60% or higher, or yet more preferably 70% or higher (e.g. 75% or higher, typically 90% or higher). All the repeat units in the hydrophilic region may consist essentially of hydrophilic units. Preferable examples of the hydrophilic unit include the VA unit and VP unit. The hydrophilic region is preferably a vinyl alcohol-based region or vinylpyrrolidone-based region comprising the VA unit or VP unit at the molar ratio. The polymer $M_{L\text{-}end}$ having a hydrophilic region as described above may preferably be a vinyl alcohol-based polymer or a vinylpyrrolidone-based polymer.

Examples of a polymerizable monomer that can be the hydrophobic unit include vinyl alkylacetates with four or more carbons such as vinyl butyrate, vinyl sorbate, vinyl hexanoate, vinyl ethylhexanoate, vinyl laurate, vinyl stearate, etc.; (meth)acrylic acid esters with four or more carbons such as butyl (meth)acrylate, hexyl (meth)acrylate, cyclohexyl (meth)acrylate, ethylhexyl (meth)acrylate, octyl (meth)acrylate, nonyl (meth)acrylate, isodecyl (meth)acrylate, lauryl (meth)acrylate, stearyl (meth)acrylate, pentadecyl (meth)acrylate, cetyl (meth)acrylate, behenyl (meth)acrylate, 3-(trimethoxysilyl)propyl (meth)acrylate, etc.; aromatic vinylic monomers such as styrene, α-methylstyrene, vinyltoluene, t-butylstyrene, etc.; and the like. These can be used singly as one species or in a combination of two or more species. In particular, vinyl esters of linear or branched saturated monocarboxylic acids with 4 to 16 (e.g. 4 to 10, typically 4 to 8) carbon atoms and (meth)acrylic acid esters having alkyl groups with 4 to 10 (e.g. 4 to 8, typically 4 to 6) carbon atoms are preferable.

The hydrophobic unit can be introduced into the hydrophilic region, in a form of a random copolymer, alternating copolymer or block copolymer. Alternatively, the hydrophobic unit may be introduced into the main chain or side chains. The molar ratio of the hydrophobic unit in the hydrophilic region is usually below 50%, or can be preferably 40% or lower (e.g. 30% or lower, typically 25% or lower). The molar ratio of the hydrophobic unit can also be 10% or lower.

The hydrophilic region of the polymer Wend disclosed herein may be a region formed with one, two or more species of repeat unit having an SP value of 11.0 or higher. The repeat unit having an SP value of 11.0 or higher includes VP unit (SP value 11.0), acrylamide unit (SP value 14.5), VA unit (SP value 18.5), acrylic acid unit (SP value 20.2), and the like. As for the SP value of a repeat unit (when two or more repeat unit species are included, their average SP value; the same applies hereinafter), from the standpoint of preferably producing the effect of the hydrophobic region, it can be 14 or higher (e.g. 18 or higher).

Herein, SP values refer to solubility parameter values. In this description, the SP value of a repeat unit constituting the water-soluble polymer refers to the value determined from the total molar heat of vaporization ($\Sigma \Delta H$) and total molar volumes ($\Sigma V$) of atomic groups according to "*Specific Interactions and the Miscibility of Polymer Blend*" by Michael M. Coleman et al. (1991) Technomic Publishing Co. Inc., by an equation (1) below:

$$SP \text{ value } (\delta(cal/cm^{-3})^{1/2}) = (\Sigma \Delta H / \Sigma V)^{1/2} \quad (1)$$

The hydrophilic region may have, for instance, an amide structure, heterocyclic structure, vinyl structure, polyoxyalkylene structure, etc. Especially, a hydrophilic region having a vinyl structure in its main chain backbone is preferable in view of the attractive properties relative to substrate surfaces and also in industrial aspects. Examples of a polymer having a hydrophilic region include polyvinyl alcohol and a polymer comprising VA units.

The hydrophobic region present in the main chain of the polymer $M_{L\text{-}end}$ is a region that shows overall hydrophobicity and is located at least at one end of the main chain. Having the hydrophobic region at the end of the main chain, the polymer $M_{L\text{-}end}$ disclosed herein is attracted well to, for instance, a polishing object (e.g. a silicon wafer) having a hydrophobic surface. This provides suitable wettability to the polishing object's surface. It also brings about increased protection for the polishing object's surface and reduction of haze and defects. As described above, the polymer $M_{L\text{-}end}$ contributes to reduction of surface defects by a different mechanism from the polymer $M_{C\text{-}end}$. Thus, the combined use of the polymers $M_{C\text{-}end}$ and $M_{L\text{-}end}$ can reduce surface defects to a greater extent. Since the polymers $M_{C\text{-}end}$, $M_{A\text{-}end}$ and $M_{L\text{-}end}$ may reduce surface defects individually by different mechanisms, the polishing composition comprising these three types of water-soluble polymer can reduce surface defects to a yet greater extent. The hydrophobic region can typically be a nonionic region.

The hydrophobic region is preferably present only at one end of the main chain of the polymer $M_{L\text{-}end}$. For instance, when the polishing object has a hydrophobic surface, with the hydrophobic region being present only at the one end of the main chain of the polymer $M_{L\text{-}end}$, the polymer $M_{L\text{-}end}$ is suitably attracted at the end to the surface of the polishing object and contributes to reduction of haze and defects.

The hydrophobic region disclosed herein has at least one hydrophobic group. The maximum number of hydrophobic groups in the hydrophobic region is not particularly limited. From the standpoint of obtaining good attraction to a polishing object, it is suitably about 50 or below (e.g. 10 or below, typically 5 or below). The number of hydrophobic groups in the hydrophobic region is one or two. Examples of the hydrophobic group include alkyl groups, phenyl groups and allyl groups as well as polymers having these, polydimethylsiloxane, polyalkyleneoxide and the like. In particular, alkyl groups are preferable. The art disclosed herein can be particularly preferably implemented in an embodiment comprising a polymer $M_{L\text{-}end}$ in which a hydrophobic region having an alkyl group (e.g. isobutyl group) is placed at an end of the main chain having a vinyl alcohol-based region or vinylpyrrolidone-based region as the hydrophilic region. The hydrophobic group may typically be a nonionic group.

The method for introducing a hydrophobic region is not particularly limited. For instance, by using a hydrophobic group-containing polymerization initiator in preparing the polymer $M_{L\text{-}end}$, a hydrophobic region can be introduced into an end of the main chain of the polymer $M_{L\text{-}end}$. Alternatively, a hydrophobic region may be introduced by the use of a chain transfer agent or polymerization terminator having a hydrophobic group in preparing the polymer $M_{L\text{-}end}$. The structure having a hydrophobic region at an end of the main chain can be obtained also by preparing a block copolymer formed with a hydrophobic group-containing repeat unit block (typically a block (hydrophobic block) formed with a hydrophobic region)) and a block (non-hydrophobic block) formed with a non-hydrophobic (typically hydrophilic) region by a known polymerization method. In particular, it is preferable to introduce the hydrophobic region by using a polymerization initiator having a hydrophobic group since it can introduce the hydrophobic group into a terminus of the main chain. In this case, the hydrophobic group is derived from the polymerization initiator. Examples of the hydrophobic group-containing polymerization initiator include azo-based and peroxide-based polymerization initiators having hydrocarbon units in the structures. Specific examples include 2,2'-azobisisobutylonitrile (AIBN), 2,2'-azobis(2,4-dimethylvaleronitrile), t-butylhydroperoxide, benzoylperoxide, etc.

A polymeric azo polymerization initiator comprising a polydimethylsiloxane unit or polyalkyleneoxide unit can be used as well. The use of these initiators can introduce into one terminus of the polymer a polydimethylsiloxane or polyalkyleneoxide as the hydrophobic block In an example of the method using a chain transfer agent, radical polymerization is carried out in the presence of a thiol having a hydrophobic alkyl group such as lauryl mercaptan to introduce the hydrophobic alkyl group into one terminus of the polymer.

Accordingly, the hydrophobic region of the polymer $M_{L\text{-}end}$ in the art disclosed herein is not limited to a region having at least one hydrophobic group derived from a polymerization initiator.

The hydrophobic region of the polymer $M_{L\text{-}end}$ disclosed herein may be constituted with a unit having an SP value below 11.0. The unit can typically be derived from a polymerization initiator. In addition to the polymerization initiator-derived unit, one, two or more species of repeat unit having an SP value below 11.0 may be included. From the standpoint of the attraction to the polishing object, the SP value of the hydrophobic region-constituting unit (when two or more repeat unit species are contained, their average SP value; the same applies hereinafter) can be 10.5 or lower (e.g. 10.0 or lower, typically 9.0 or lower).

The hydrophobic region is preferably essentially free of a hydrophilic repeat unit. Herein, being essentially free of a hydrophilic repeat unit means that the molar ratio of the hydrophilic repeat unit in the region is below 0.01% (e.g. below 0.001%). The hydrophobic region may consist essentially of a hydrophobic terminus derived from a polymerization initiator and hydrophobic units. As the polymerizable monomer that can become a hydrophobic unit capable of constituting the hydrophobic region, the examples given above for the polymerizable monomer that can be a hydrophobic unit in the hydrophilic region can be preferably used.

As described above, the hydrophobic group is typically derived from a polymerization initiator; and therefore, the hydrophobic group may be present at a terminus of the main chain of the polymer $M_{L\text{-}end}$. Because of this, the polymer $M_{L\text{-}end}$ can well protect the polishing object's surface. From the standpoint of protecting the polishing object's surface, the hydrophobic group is more preferably present only at one terminus of the main chain of the polymer $M_{L\text{-}end}$. In this case, for instance, a single hydrophobic group may happen to be present in the hydrophobic region, yet such a structure can also reduce the haze and defects.

The ratio of the number of moles of the hydrophobic region in the number of moles of repeat units in the entire main chain of the polymer $M_{L\text{-}end}$ is usually below 50%, or suitably 25% or below (e.g. 10% or below, typically 5% or below). The ratio of the number of moles of the hydrophobic region can be 1% or below.

When the polymer $M_{L\text{-}end}$ has one or more side chains besides the main chain, the side chains can be hydrophilic as well. The polymer $M_{L\text{-}end}$ disclosed herein may be hydrophilic except at the hydrophobic region located at least at one end (preferably only at one end) of its main chain. Accordingly, the polymer $M_{L\text{-}end}$ disclosed herein may be formed with a hydrophobic region located at least at one end (preferably only at one end) of the main chain and a hydrophilic region.

The molar ratio of the hydrophilic unit in all the repeat units (the total of the repeat units constituting the polymer including the main chain and side chains) of the polymer $M_{L\text{-}end}$ is, from the standpoint of the water solubility, usually suitably 50% or higher or preferably 60% or higher (e.g. 70% or higher, typically 75% or higher). The molar ratio of the hydrophilic unit can be 90% or higher (e.g. 95% or higher, typically 99% or higher). The molar ratio of the hydrophobic unit in all the repeat units (the total of the repeat units constituting the polymer including the main chain and side chains) of the polymer $M_{L\text{-}end}$ is usually suitably 50% or lower or preferably 40% or lower (e.g. 30% or lower, typically 25% or lower). The molar ratio of the hydrophobic unit can be 10% or lower (e.g. 5% or lower, typically 1% or lower).

The type of the polymer $M_{L\text{-}end}$ is not particularly limited. For instance, among the water-soluble polymers listed later as examples, a species that can serve as the polymer $M_{L\text{-}end}$ (typically a water-soluble polymer having a hydrophilic region in the main chain) can be preferably used. For the polymer $M_{L\text{-}end}$, solely one species or a combination of two or more species can be used. In particular, a vinyl alcohol-based polymer and vinylpyrrolidone-based polymer are more preferable, with the vinyl alcohol-based polymer being even more preferable. The polymer $M_{L\text{-}end}$ according to a preferable embodiment of the art disclosed herein is a vinyl alcohol-based polymer having a hydrophobic region at an end of its main chain. As the polymer $M_{L\text{-}end}$, a vinyl alcohol-based polymer that has a hydrophobic group (e.g. an alkyl group, typically isobutyl group) at a terminus of the main chain is particularly preferable.

When the polymer $M_{L\text{-}end}$ is used, there are no particular limitations to the usage ratio of polymer $M_{C\text{-}end}$ to polymer $M_{L\text{-}end}$ (which can be thought as their content ratio in the polishing composition). From the standpoint of producing the effect of the combined use of the polymers $M_{C\text{-}end}$ and $M_{L\text{-}end}$ to a greater extent, their usage ratio ($M_{C\text{-}end}$:$M_{L\text{-}end}$) is suitably 5:95 to 95:5 by weight or preferably 10:90 to 90:10 (e.g. 20:80 to 80:20).

<Optional Water-Soluble Polymer>

In addition to the polymer $M_{C\text{-}end}$, the polishing composition disclosed herein may comprise, as necessary, a water-soluble polymer (or "optional polymer" hereinafter) different from the polymers $M_{C\text{-}end}$, $M_{A\text{-}end}$ and $M_{L\text{-}end}$. The type of such optional polymer is not particularly limited. A suitable species can be selected among water-soluble polymers known in the field of polishing compositions.

The optional polymer may have in its molecule at least one species of functional group selected from cationic groups, anionic groups and nonionic groups. The optional polymer may have in its molecule, for instance, a hydroxyl group, carboxyl group, acyloxy group, sulfo group, primary amide structure, quaternary nitrogen structure, heterocyclic structure, vinyl structure, polyoxyalkylene structure, etc. From the standpoint of reducing aggregates and increasing the washability and so on, a nonionic polymer can be preferably used as the optional polymer.

As the optional polymer in the polishing composition disclosed herein, for instance, one, two or more species selected from the water-soluble polymers listed later as examples can be preferably used.

The optional polymer is used in an amount of suitably 100% by weight or less of the polymer $M_{C\text{-}end}$ in the polishing composition, preferably 50% by weight or less, or yet more preferably 30% by weight or less (e.g. 10% by weight or less). The polishing composition disclosed herein can be preferably made in an embodiment essentially free of an optional polymer (e.g. the optional polymer content in the total amount of the water-soluble polymers is below 1% by weight or no optional polymer is detected).

When the polishing composition disclosed herein comprises a cellulose derivative as an optional polymer, it is preferably used in an amount as low as or lower than 10% by weight of the total amount of the water-soluble polymer in the polishing composition, or yet more preferably 5% by weight or less (typically 1% by weight or less). This can more greatly inhibit contamination and aggregation caused by the use of a cellulose derivative from a natural compound.

<Common Features among Water-Soluble Polymers>

Comprehensive description is provided next with respect to common features (technical features including the structures, properties, etc.) that can be commonly applied to water-soluble polymers that may be contained in the polishing composition disclosed herein, that is, water-soluble polymers including the polymers $M_{C\text{-}end}$, $M_{A\text{-}end}$, $M_{L\text{-}end}$ and other water-soluble polymers (the same applies, hereinafter).

There are no particular limitations to the types of water-soluble polymer that can be contained in the polishing composition disclosed herein. Suitable species can be used among vinyl alcohol-based polymers, acrylic polymers, oxyalkylene unit-containing polymers, nitrogen atom-containing polymers and the like. From the standpoint of the protection of the polishing object, the polishing composition disclosed herein may be free of an oxyalkylene unit-containing polymer as the water-soluble polymer.

The main chain structure of the water-soluble polymer is not particularly limited. It can be formed with carbon-carbon bonds or comprise an oxygen atom (O) or nitrogen atom (N) in the main chain. In particular, the water-soluble polymer preferably has a main chain formed with carbon-carbon bonds (—C—C—). A water-soluble polymer having such a main chain suitably is attracted to a polishing object having a hydrophobic surface, providing excellent protection to the polishing object. The main chain being formed with carbon-carbon bonds is preferable also from the standpoint of reducing aggregates and increasing the washability The carbon-carbon bonds are preferably derived from vinyl groups of vinyl group-containing monomers such as VA, ACMO, VP and the like.

The vinyl alcohol-based polymer is typically a PVA (a polymer comprising a VA unit as the primary repeat unit in the polymer). In the polymer, the ratio of the number of moles of the VA unit in the number of moles of all repeat units is usually 50% or higher, or suitably 80% or higher (e.g. 90% or higher, typically 95% or higher). Essentially all the repeat units in the water-soluble polymer may consist essentially of VA units. In the PVA, the type of repeat unit other than the VA unit is not particularly limited. Examples include a vinyl acetate unit, vinyl propionate unit, vinyl hexanoate unit, etc.

The PVA has a degree of saponification of typically 65% by mole or greater, preferably 80% by mole or greater, or yet more preferably 90% by mole or greater. From the standpoint of the performance stability of the polishing composition, a particularly preferable PVA has a degree of saponification of 95% by mole or greater (typically above 95%, e.g. 98% by mole or greater). The PVAs degree of saponification is theoretically 100% by mole or less.

The acrylic polymer typically comprises a (meth)acryloyl-based monomeric unit. Herein, the term "(meth)acryloyl" comprehensively refers to acryloyl and methacryloyl. An example is a polymer comprising an acrylic acid (AA) unit and/or methacrylic acid (MAA) unit as the primary repeat unit(s) in the polymer. In the polymer, the ratio of the number of moles of the AA and MAA units in the number of moles of all repeat units is preferably 50% or higher or more preferably 80% or higher (e.g. 90% or higher, typically 95% or higher). All the repeat units in the water-soluble polymer may consist essentially of AA and MAA units. In particular, in the polymer, an acrylic acid-based polymer (polyacrylic acid) in which the ratio of the number of moles of the AA unit in the number of moles of all repeat units is 50% or higher (e.g. 80% or higher, typically 90% or higher) is preferable.

The oxyalkylene group-containing polymer may comprise one, two or more species of oxyalkylene group with 2 to 6 carbon atoms (typically, a structural group represented by —$C_nH_{2n}O$— wherein n is an integer between 2 and 6). The number of carbon atoms in the oxyalkylene group is preferably 2 to 3. Examples of such a polymer include a polyethylene oxide (PEO), a block copolymer of ethylene oxide (EO) and propylene oxide (PO), a random copolymer of EO and PO, and the like.

The block copolymer of EO and PO can be a diblock, triblock or the like comprising a polyethylene oxide (PEO) block and a polypropylene oxide (PPO) block. Examples of the triblock include a PEO-PPO-PEO triblock and PPO-PEO-PPO triblock. Usually, a PEO-PPO-PEO triblock is more preferable.

As the PEO-PPO-PEO triblock, a polymer represented by the following formula (2) can be preferably used:

$$HO\text{-}(EO)_a\text{-}(PO)_b\text{-}(EO)_c\text{-}H \quad (2)$$

In the general formula (2), EO represents an oxyethylene group (—CH2CH2O—), PO represents an oxypropylene group (—CH2CH(CH3)O—), and each of a, b and c is an integer of 1 or higher (typically 2 or higher).

In the general formula (2), the total of a and c is preferably in a range of 2 to 1000, more preferably in a range of 5 to 500, or yet more preferably in a range of 10 to 200. In the general formula (2), b is preferably in a range of 2 to 200, more preferably in a range of 5 to 100, or yet more preferably in a range of 10 to 50.

In the block or random copolymer of EO and PO, from the standpoint of the water solubility and washability, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, either a polymer containing nitrogen atoms in the main chain or a polymer having a nitrogen atom in the side chain functional group (pendant group) can be used.

Examples of the polymer having a nitrogen atom in the main chain include a homopolymer and a copolymer of an N-acylalkyleneimine-based monomer. Specific examples of the N-acylalkyleneimine-based monomer include N-acetylethyleneimine, N-propionylethyleneimine, N-caproylethyleneimine, N-benzoylethyleneimine, N-acetylpropyleneimine, N-butyrylethyleneimine, etc. The homopolymer of N-acylalkyleneimine-based monomer include poly(N-acetylethyleneimine), poly(N-propionylethyleneimine), poly(N-caproylethyleneimine), poly(N-benzoylethyleneimine), poly(N-acetylpropyleneimine), poly(N-butyrylethyleneimine), etc. Examples of the copolymer of the N-acylalkyleneimine-based monomer include a copolymer of two or more species of N-acylalkyleneimine-based monomer and a copolymer of one, two or more species of N-acylalkyleneimine-based monomer and another monomer.

Unless otherwise indicated, the copolymer in this description comprehensively means various copolymers such as random copolymer, alternating copolymer, block copolymer, graft copolymer, etc.

Examples of a polymer having a nitrogen atom in a pendant group include a polymer comprising an N-(meth)acryloyl monomeric unit, a polymer comprising an N-vinyl monomeric unit, etc.

Examples of the N-(meth)acryloyl monomeric unit-containing polymer include a homopolymer of an N-(meth)acryloyl-based monomer and a copolymer thereof (typically a copolymer in which the copolymerization ratio of N-(meth)acryloyl-based monomer exceeds 50% by weight). Examples of the N-(meth)acryloyl-based monomer include an acyclic amide having an N-(meth)acryloyl group and a cyclic amide having an N-(meth)acryloyl group.

Examples of an acyclic amide having an N-(meth)acryloyl group include: (meth)acrylamide; N-alkyl(meth)acrylamides such as N-methyl(meth)acrylamide, ethyl(meth)acrylamide, N-propyl(meth)acrylamide, N-isopropyl(meth)acrylamide, N-n-butyl(meth)acrylamide, etc.; N,N-dialkyl(meth)acrylamides such as N,N-dimethyl(meth)acrylamide, N,N-diethyl(meth)acrylamide, N,N-dipropyl(meth)acrylamide, N,N-diisopropyl(meth)acrylamide, N,N-di(n-butyl)(meth)acrylamide, etc.; and the like. Examples of a polymer comprising a N-(meth)acryloyl group-containing acyclic amide as a monomeric unit include a homopolymer of N-isopropylacrylamide and a copolymer of N-isopropylacrylamide (e.g. a copolymer in which the copolymerization ratio of N-isopropylacrylamide exceeds 50% by weight).

Examples of the N-(meth)acryloyl group-containing cyclic amide include N-(meth)acryloylmorpholine, N-(meth)acryloylpyrrolidine, etc. Examples of a polymer comprising an N-(meth)acryloyl group-containing cyclic amide as a monomeric unit include an acryloylmorpholine-based polymer (PACMO). The acryloylmorpholine-based polymer is typically a homopolymer of N-acryloylmorpholine (ACMO) and a copolymer of ACMO (e.g. a copolymer in which the copolymerization ratio of ACMO exceeds 50% by weight). In the acryloylmorpholine-based polymer, the ratio of the number of moles of the ACMO unit in the number of moles of all repeat units is usually 50% or higher, or suitably 80% or higher (e.g. 90% or higher, typically 95% or higher). All the repeat units in the water-soluble polymer may consist essentially of ACMO units.

Examples of the N-vinyl monomeric unit-containing polymer include a homopolymer of an N-vinyllactam-based monomer and a copolymer thereof (e.g. a copolymer in which the copolymerization ratio of the N-vinyllactam-based monomer exceeds 50% by weight), a homopolymer of an acyclic N-vinylamide and a copolymer thereof (e.g. a copolymer in which the copolymerization ratio of the acyclic N-vinylamide exceeds 50% by weight).

Specific examples of the N-vinyllactam-based monomer include N-vinylpyrrolidone (VP), N-vinylpiperidone, N-vinylmorpholinone, N-vinylcaprolactam (VC), N-vinyl-1,3-oxazine-2-one, N-vinyl-3,5-morpholinedione, etc. Specific examples of the N-vinyllactam monomeric unit-containing polymer include a polyvinylpyrrolidone (PVP), polyvinylcaprolactam, random copolymer of VP and VC, random copolymer of one or each of VP and VC with another vinyl monomer (e.g. acrylic monomer, vinyl ester-based monomer, etc.), block copolymer and graft copolymer comprising a polymer segment with one or each of VP and VC (e.g. a graft copolymer obtained by grafting PVA with PVP), and the like. In particular, vinylpyrrolidone-based polymers (PVP) such as a VP homopolymer and VP copolymer (e.g. a copolymer in which the copolymerization ratio of VP exceeds 50% by weight) are preferable. In a vinylpyrrolidone-based polymer, the ratio of the number of moles of the VP unit in the number of moles of all repeat units is usually 50% or higher, or suitably 80% or higher (e.g. 90% or higher, typically 95% or higher). All the repeat units in the water-soluble polymer may consist essentially of VP units.

Example of the polymer comprising an N-(meth)acryloyl group-containing acyclic amide as a monomeric unit include a homopolymer of N-isopropylacrylamide and a copolymer thereof (e.g. a copolymer in which the copolymerization ratio of N-isopropylacrylamide exceeds 50% by weight).

Specific examples of the acyclic N-vinylamide include N-vinylacetamide, N-vinylpropionic acid amide, N-vinylbutyric acid amide, etc.

Other examples of a polymer having a nitrogen atom in a pendant group include a homopolymer and a copolymer of an amino group-containing vinyl monomer (e.g. a monomer having a (meth)acryloyl group) such as aminoethyl (meth)acrylate, N,N-dimethylaminoethyl (meth)acrylate, N,N-dimethylaminopropyl (meth)acrylate, etc.

The water-soluble polymer disclosed herein may be a cellulose derivative (cellulose-based polymer), for instance, a hydroxyethyl cellulose-based polymer. When the polishing composition disclosed herein comprises a cellulose derivative as the water-soluble polymer, it is preferably used in an amount as low as or lower than 10% by weight of the total amount of the water-soluble polymer in the polishing composition, or more preferably 5% by weight or less (typically 1% by weight or less). This can bring about greater inhibition of contamination and aggregation caused by the use of a naturally-derived cellulose derivative. The polishing composition disclosed herein can be preferably made, for instance, in an embodiment essentially free of a cellulose derivative (e.g. the amount of cellulose derivatives in the total amount of the water-soluble polymer is below 1% by weight or no cellulose derivative is detected).

The water-soluble polymer disclosed herein has a weight average molecular weight (Mw) of $2\times10^3$ or larger. Accordingly, in this description, the water-soluble polymer can be defined as a compound having a Mw of $2\times10^3$ or larger. On the other hand, the upper limit of molecular weight of the water-soluble polymer is not particularly limited. For instance, a water-soluble polymer having a weight average molecular weight (Mw) of $200\times10^4$ or smaller (e.g. $150\times10^4$ or smaller, typically $100\times10^4$ or smaller) can be used. From the standpoint of preventing formation of aggregates to a greater extent, usually, a water-soluble polymer having a Mw of smaller than $100\times10^4$ (more preferably $90\times10^4$ or smaller, yet more preferably $80\times10^4$ or smaller, typically $70\times10^4$ or smaller) can be preferably used. From the standpoint of reducing haze and surface defects, the lower Mw limit of the water-soluble polymer is preferably $4\times10^3$ or larger (e.g. $6\times10^3$ or larger). In particular, a water-soluble polymer having a Mw of $1\times10^4$ or larger is more preferable.

In a preferable embodiment of the art disclosed herein, from the standpoint of preventing formation of aggregates to a greater extent, a water-soluble polymer having a Mw below $100\times10^4$ (more preferably $80\times10^4$ or smaller, yet more preferably $50\times10^4$ or smaller, typically $40\times10^4$ or smaller, e.g. $30\times10^4$ or smaller) is used. From the standpoint of the ease of filtration and washability of the polishing composition, etc., a water-soluble polymer having a Mw of $25\times10^4$ or smaller (more preferably $20\times10^4$ or smaller, yet more preferably $15\times10^4$, e.g. $10\times10^4$ or smaller) can be preferably used. From the standpoint of reducing haze and surface defects, the lower Mw limit of the water-soluble polymer is preferably $4\times10^3$ or larger (e.g. $6\times10^3$ or larger). In particular, a water-soluble polymer having a Mw of $1\times10^4$ or larger is more preferable. For instance, a vinyl alcohol-based polymer having such a Mw can be preferably used.

In another preferable embodiment disclosed herein, from the standpoint of reducing haze and surface defects, a water-soluble polymer having a lower Mw limit of $10\times10^4$ or larger (more preferably $15\times10^4$ or larger, yet more preferably $20\times10^4$ or larger, particularly preferably $30\times10^4$ or larger, e.g. $40\times10^4$ or larger) is used. From the standpoint of inhibiting formation of aggregates, the upper Mw limit of the water-soluble polymer is preferably $80\times10^4$ or smaller (more preferably $70\times10^4$ or smaller). For instance, an acryloylmorpholine-based polymer having such a Mw can be preferably used.

In the art disclosed herein, the relationship between the weight average molecular weight (Mw) and number average molecular weight (Mn) of the water-soluble polymer is not particularly limited. From the standpoint of preventing formation of aggregates, etc., for instance, a species having a molecular weight distribution (Mw/Mn) of 5.0 or less can be preferably used. From the standpoint of the performance stability of the polishing composition, the Mw/Mn of the water soluble polymer is preferably 4.0 or less, more preferably 3.5 or less, or yet more preferably 3.0 or less (e.g. 2.5 or less).

In theory, the Mw/Mn is 1.0 or greater. From the standpoint of the availability of starting materials and the ease of synthesis, in usual, a water-soluble polymer having an Mw/Mn of 1.05 or greater can be preferably used.

As the Mw and Mn of a water-soluble polymer, the values (aqueous, based on standard polyethylene oxide) based on aqueous gel permeation chromatography (GPC) can be used.

Although not particularly limited to, when the polishing composition disclosed herein comprises an abrasive, the water-soluble polymer content (the total amount of the polymers $M_{C-end}$, $M_{A-end}$, $M_{L-end}$ and other water-soluble polymers) can be, for instance, 0.01 part by weight or greater to 100 parts by weight of the abrasive. From the standpoint of increasing the post-polishing surface smoothness (e.g. reducing the haze and defects), the water-soluble polymer content relative to 100 parts by weight of the abrasive is suitably 0.02 part by weight or greater, preferably 0.03 part by weight or greater, or more preferably 0.05 part by weight or greater (e.g. 0.1 part by weight or greater). From the standpoint of the polishing rate and washability, etc., the water-soluble polymer content relative to 100 parts by weight of the abrasive can be, for instance, 40 parts by weight or less, usually suitably 20 parts by weight or less, preferably 15 parts by weight or less, or more preferably 10 parts by weight or less.

<Water>

As the water in the polishing composition disclosed herein, ion-exchanged water (deionized water), pure water, ultrapure water, distilled water and the like can be preferably used. To avoid hindering the effects of other components in the polishing composition whenever possible, in the water used, for instance, the total transition metal ion content is preferably 100 ppb or less. For example, the purity of the water can be increased by operations such as removing impurity ions with ion-exchange resin, removing contaminants with a filter, distillation, and so on.

The polishing composition disclosed herein may further comprise, as necessary, a water-miscible organic solvent (lower alcohol, lower ketone, etc.). In usual, of the solvent in the polishing composition, preferably 90% by volume or more is water, or more preferably 95% by volume or more (typically 99 to 100% by volume) is water.

The polishing composition disclosed herein (typically a slurry composition) can be preferably made, for instance, in an embodiment in which the non-volatile content (NV) is 0.01% by weight to 50% by weight and the rest is an aqueous solvent (water or a mixture of water and an organic solvent) or in an embodiment where the rest is an aqueous solvent and a volatile compound (e.g. ammonia). An embodiment wherein the NV is 0.05% by weight to 40% by weight is more preferable. The non-volatile content (NV) refers to the weight proportion of residue remaining in the polishing composition after drying the polishing composition at 105° C. for 24 hours.

<Abrasive>

The polishing composition disclosed herein preferably comprises an abrasive. The material and properties of the abrasive disclosed herein are not particularly limited and can be suitably selected in accordance with the purpose and application of the polishing composition, etc. Examples of the abrasive include inorganic grains, organic grains and organic/inorganic composite grains. Specific examples of inorganic grains include oxide grains such as silica grains, alumina grains, cerium oxide grains, chromium oxide grains, titanium dioxide grains, zirconium oxide grains, magnesium oxide grains, manganese dioxide grains, zinc oxide grains, red oxide grains, etc.; nitride grains such as silicon nitride grains, boron nitride grains, etc.; carbide grains such as silicon carbide grains, boron carbide grains, etc.; diamond grains; carbonates such as calcium carbonate, barium carbonate, etc.; and the like. Specific examples of organic grains include polymethyl methacrylate (PMMA) grains, poly(meth)acrylic acid grains (herein the (meth) acrylic acid comprehensively means acrylic acid and methacrylic acid), polyacrylonitrile grains, and the like. These abrasives can be used singly as one species or in a combination of two or more species.

As the abrasive, inorganic grains are preferable. In particular, grains of an oxide of a metal or metalloid are preferable. Preferable examples of the abrasive that can be used in the art disclosed herein include silica grains. This is because when silica grains formed of oxygen atoms and the same element as the polishing object (a silicon wafer) are used as the abrasive, residues of a metal or metalloid different from silicon will not be left after the polishing, eliminating risks such as contamination of the silicon wafer surface and degradation of electrical properties of the silicon wafer caused by dispersion of residues of a metal or metalloid different from silicon in the polishing object. An example of an embodiment of the polishing composition preferable from such a standpoint is a polishing composition consisting of silica grains as the abrasive. By nature, silica can be readily obtained in a highly pure state. This is also one of the reasons that silica grains are preferable as the abrasive. Specific examples of silica grains include colloidal silica, fumed silica, precipitated silica and the like. From the standpoint of the less likelihood of scratching the polishing object's surface and capability of making a surface with lower haze, colloidal silica and fumed silica are cited as preferable silica grains. Colloidal silica is particularly preferable. In particular, colloidal silica is preferably used as the abrasive in the polishing composition used for polishing (especially, final polishing) of a silicon wafer.

The silica constituting the silica grains has a true specific gravity of preferably 1.5 or higher, more preferably 1.6 or higher, or yet more preferably 1.7 or higher. With increasing true specific gravity of the silica, the polishing rate (amount of surface removed from polishing object's surface per unit time) may increase when polishing a silicon wafer. From the standpoint of reducing scratches occurring in the surface (polished surface) of the polishing object, preferable silica grains have a true specific gravity of 2.2 or lower. As the true specific gravity of the silica, the value measured by a liquid displacement method using ethanol as the displacing liquid can be used.

In the art disclosed herein, the abrasive in the polishing composition can be in a form of primary particles or in a form of secondary particles which are aggregates of primary particles. Alternatively, the abrasive may be present both in the primary particle form and secondary particle form. In a preferable embodiment, the abrasive is present at least partially in a secondary particle form in the polishing composition.

The average primary particle diameter $D_{P1}$ is not particularly limited. From the standpoint of the polishing efficiency, etc., it is preferably 5 nm or larger, or more preferably 10 nm or larger. From the standpoint of obtaining greater effects of polishing (e.g. effects such as reduced haze, removal of defects, etc.), the average primary particle diameter $D_{P1}$ is preferably 15 nm or larger, or more preferably 20 nm or larger (e.g. larger than 20 nm). From the standpoint of the likelihood of yielding a highly smooth surface, the abrasive has an average primary particle diameter Dpi of preferably 100 nm or smaller, more preferably 50 nm or smaller, or yet more preferably 40 nm or smaller. From the standpoint of the likelihood of obtaining a higher-quality surface (e.g. a surface with reduced defect such as LPD (light point defect), PID, etc.), the art disclosed herein can also be preferably implemented in an embodiment using an abrasive having an average primary particle diameter Dpi of 35 nm or smaller (more preferably 32 nm or smaller, e.g. smaller than 30 nm).

In the art disclosed herein, the abrasive's average primary particle diameter $D_{P1}$ can be determined, for instance, from the specific surface area S (m²/g) measured by the BET method, based on the equation for the average primary particle diameter $D_{P1}$ (nm)=2727/S. The abrasive's specific surface area can be measured by using, for instance, a surface area analyzer under trade name "FLOW SORB II 2300" available from Micromeritics.

The average secondary particle diameter $D_{P2}$ of the abrasive is not particularly limited. From the standpoint of the polishing rate, etc., it is preferably 10 nm or larger, or more preferably 20 nm or larger. From the standpoint of obtaining greater effects of polishing, the average secondary particle diameter $D_{P2}$ is preferably 30 nm or larger, more preferably 35 nm or larger, or yet more preferably 40 nm or larger (e.g. larger than 40 nm). From the standpoint of yielding a highly smooth surface, the abrasive has an average secondary particle diameter $D_{P2}$ of suitably 200 nm or smaller, preferably 150 nm or smaller, or more preferably 100 nm or smaller. From the standpoint of the likelihood of obtaining a higher-quality surface (e.g. a surface with reduced defect such as LPD, PID, etc.), the art disclosed herein can also be preferably practiced in an embodiment using an abrasive having an average secondary particle diameter $D_{P2}$ of smaller than 70 nm (more preferably 60 nm or smaller, e.g. smaller than 50 nm).

The abrasive's average secondary particle diameter $D_{P2}$ can be measured for an aqueous dispersion of the abrasive of interest as a measurement sample by dynamic light scattering using, for instance, model "UPA-UT151" available from Nikkiso Co., Ltd.

The abrasive's average secondary particle diameter $D_{P2}$ is generally equal to or larger than the abrasive's average primary particle diameter $D_{P1}$ ($D_{P2}/D_{P1} \geq 1$) and is typically larger than $D_{P1}$ ($D_{P2}/D_{P1} > 1$). Although not particularly limited, from the standpoint of the effects of polishing and post-polishing surface smoothness, $D_{P2}/D_{P1}$ of the abrasive is usually suitably in a range of 1.2 to 3, preferably in a range of 1.5 to 2.5, or more preferably in a range of 1.7 to 2.3 (e.g. greater than 1.9, but 2.2 or less).

The abrasive grain may have a globular shape (external shape) or a non-globular shape. Specific examples of non-globular shapes of the abrasive include a peanut shape (i.e. peanut shell shape), cocoon shape, confeito shape (spiky ball shape), rugby ball shape, and so on. For instance, an abrasive whose grains are mostly peanut-shaped can be preferably used.

Although not particularly limited, the abrasive has an average value of primary particle's major axis to minor axis ratio (average aspect ratio) of preferably 1.05 or higher, or more preferably 1.1 or higher. With increasing average aspect ratio of the abrasive, a higher polishing rate can be obtained. From the standpoint of scratch reduction and so on, the abrasive's average aspect ratio is preferably 3.0 or lower, more preferably 2.0 or lower, or yet more preferably 1.5 or lower.

The abrasive's shape (external shape) and average aspect ratio can be assessed, for instance by electron microscope observations. In specific procedures for determining the average aspect ratio, for instance, using a scanning electron microscope (SEM), with respect to a prescribed number (e.g. 200) of abrasive grains having observable separate shapes, the smallest circumscribing rectangles are drawn on the respective grain images. With respect to the rectangle drawn on each grain image, the long side length (major axis length) is divided by the short side length (minor axis length) to determine the major axis/minor axis ratio (aspect ratio). The aspect ratios of the prescribed number of grains can be arithmetically averaged to determine the average aspect ratio.

<Basic Compound>

The polishing compound disclosed herein may typically comprise a basic compound. Herein, the basic compound refers to a compound capable of increasing the pH of a polishing composition when added to the composition. The basic compound may work to chemically polish the target surface and contribute to increase the polishing rate. The basic compound may also help increase the dispersion stability of the polishing composition (especially a polishing composition having a composition comprising an abrasive).

As the basic compound, organic or inorganic nitrogen-containing basic compounds, hydroxides of alkali metals or alkaline earth metals, various carbonates and hydrogen carbonates, etc., can be used. Examples include alkali metal hydroxides; quaternary ammonium hydroxides and salts thereof; ammonia; amines; and the like. Specific examples of alkali metal hydroxides include potassium hydroxide, sodium hydroxide, etc. Specific examples of carbonates and hydrogen carbonates include ammonium hydrogen carbonate, ammonium carbonate, potassium hydrogen carbonate, potassium carbonate, sodium hydrogen carbonate, sodium carbonate, etc. Specific examples of quaternary ammonium hydroxides or salts thereof include tetramethylammonium hydroxide, tetraethylammonium hydroxide, tetrabutylammonium hydroxide, etc. Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetraamine, anhydrous piperazine, piperazine hexahydrate, 1-(2-aminoethyl)piperazine, N-methylpiperazine, guanidine, azoles such as imidazole, triazole, etc.; and the like. These basic compounds can be used singly as one species or in a combination of two or more species.

Examples of basic compounds preferable from the standpoint of increasing the polishing rate, etc., include ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate and sodium carbonate. In particular, preferable examples include ammonia, potassium hydroxide, sodium hydroxide, tetramethylammonium hydroxide and tetraethylammonium hydroxide. As more preferable species, ammonia and tetramethylammonium hydroxide are cited. An especially preferable basic compound is ammonia.

<Surfactant>

The polishing composition disclosed herein can be preferably made in an embodiment comprising a surfactant (typically a water-soluble organic compound having a molecular weight below $2 \times 10^3$) as necessary. The use of surfactant may increase the dispersion stability of the polishing composition. It may facilitate the reduction of haze. For the surfactant, solely one species or a combination of two or more species can be used. The art disclosed herein can be preferably made in an embodiment free of a surfactant.

As the surfactant, anionic or nonionic kinds can be preferably used. From the standpoint of the low-foaming properties and easy pH adjustment, nonionic surfactants are more preferable. Examples include oxyalkylene polymers such as polyethylene glycol, polypropylene glycol, polytetramethylene glycol, etc.; polyoxyalkylene adducts such as polyoxyethylene alkyl ether, polyoxyethylene alkyl phenyl ether, polyoxyethylene alkylamine, polyoxyethylene fatty acid esters, polyoxyethylene glyceryl ether fatty acid esters, polyoxyethylene sorbitan fatty acid esters, etc.; copolymers (diblocks, triblocks, random-type, alternating-type) of several species of oxyalkylene; and the like.

Specific examples of nonionic surfactant include a block copolymer of ethylene oxide (EO) and propylene oxide (PO)-diblock, PEO(polyoxyethylene oxide)-PPO(polypropyelene oxide)-PEO triblock, PPO-PEO-PPO triblock and the like, a random copolymer of EO and PO, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene 2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene laurylamine, polyoxyethylene stearylamine, polyoxyethylene oleylamine, polyoxyethylene stearylamide, polyoxyethylene oleylamide, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalinitate, polyoxyethylene sorbitan monostearate, polyoxyethylene sorbitan monooleate, polyoxyethylenesorbitan trioleate, polyoxyethylene sorbitol tetraoleate, polyoxyethylene castor oil, polyoxyethylene hardened castor oil, and the like. Particularly preferable surfactants include a block copolymer of EO and PO (especially a PEO-PPO-PEO triblock), a random copolymer of EO and PO, and polyoxyethylene alkyl ether (e.g. polyoxyethylene decyl ether).

The surfactant typically has a molecular weight below $2 \times 10^3$. From the standpoint of the ease of filtering the polishing composition and cleaning the polishing object, etc., it is preferably $1 \times 10^3$ or smaller. The molecular weight of the surfactant is typically 200 or larger. From the standpoint of haze reduction effect, etc., it is preferably 250 or larger, or more preferably 300 or larger (e.g. 500 or larger). As the molecular weight of the surfactant, the weight average molecular weight (Mw) determined by GPC (aqueous, based on standard polyethylene glycol) or the molecular weight determined from the chemical formula can be used.

When the polishing composition disclosed herein comprises a surfactant, the weight ratio (W1/W2) of water-soluble polymer content W1 to surfactant content W2 is not particularly limited. For instance, it can be in a range of 0.01 to 500, or is in a range of preferably 1 to 300, or more preferably in a range of 5 to 200. When the W1/W2 value is at or above the aforementioned lower limit, the polishing workability (typically the polishing rate) tends to increase. When the W1/W2 value is at or below the aforementioned upper limit, the haze reduction effect tends to increase.

<Other Components>

As far as the effects by the present invention are not significantly hindered, the polishing composition disclosed herein may further comprise as necessary known additives, such as chelating agents, organic acids, organic acid salts, inorganic acids, inorganic acid salts, preservatives, antifungal agents, and so on, which can be used in polishing compositions (e.g. polishing compositions used for final polishing of silicon wafers). The art disclosed herein may be implemented in an embodiment free of an acid such as an organic acid, inorganic acid, etc. It can also be preferably implemented in an embodiment free of an oxidant (in particular, an oxidant used to oxidize metal (e.g. copper), e.g. a persulfate (e.g. ammonium persulfate) and hydrogen peroxide).

Examples of chelating agents include aminocarboxylic acid-based chelating agents and organophosphonic acid-based chelating agents. Examples of aminocarboxylic acid-based chelating agents include ethylenediamine tetraacetic acid, ethylenediamine tetraacetic acid sodium salt, nitrilotriacetic acid, nitrilotriacetic acid sodium salt, nitrilotriacetic acid ammonium salt, hydroxyethylethylenedimaine triacetic acid, hydroxyethylethylenediamine triacetic acid sodium salt, diethylenetriamine pentaacetic acid, diethylenetriamine pentaacetic acid sodium salt, triethylenetetramine hexaacetic acid, and triethylenetetramine hexaacetic acid sodium salt. Examples of organophosphonic acid-based chelating agents include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and a-methylphosphonosuccinic acid. Among them, organophosphonic acid-based chelating agents are preferable, with ethylenediaminetetrakis(methylenephosphonic acid) and diethylenetriaminepenta(methylenephosphonic acid) being more preferable. A particularly preferable chelating agent is ethylenediaminetetrakis(methylenephosphonic acid).

Examples of organic acids include formic acid; aliphatic acids such as acetic acid, propionic acid, etc.; aromatic carboxylic acids such as benzoic acid, phthalic acid, etc.; as well as citric acid, oxalic acid, tartaric acid, malic acid, maleic acid, fumaric acid, succinic acid, organic sulfonic acids, organic phosphoric acids, and the like. Examples of organic acid salts include alkali metal salts (sodium salts, potassium salts, etc.), ammonium salts and the like of organic acids. Examples of inorganic acids include sulfuric acid, nitric acid, hydrochloric acid, carbonic acid, etc. Examples of inorganic acid salts include alkali metal salts (sodium salts, potassium salts, etc.) and ammonium salts of inorganic acids. The organic acids and their salts as well as inorganic acids and their salts can be used singly as one species or in a combination of two or more species.

Examples of preservatives and antifungal agents include isothiazoline-based compounds, paraoxybenzoic acid esters, phynoxyethanol, etc.

<Applications>

The polishing composition disclosed herein can be suitably applied for polishing objects of various materials and shapes. The polishing object's material can be, for instance, a metal or metalloid such as silicon, aluminum, nickel, tungsten, copper, tantalum, titanium, stainless steel, etc., or an alloy of these; a glass-like substance such as quartz glass, aluminosilicate glass, glass carbon, etc.; a ceramic material such as alumina, silica, sapphire, silicon nitride, tantalum nitride, titanium carbide, etc.; a compound semiconductor material for substrates such as silicon carbide, gallium nitride, gallium arsenide, etc.; a resin material such as polyimide resin, etc.; or the like. The polishing object may be formed of several materials among them. In particular, it is suitable for polishing a polishing object having a surface formed of silicon. The art disclosed herein can be particularly preferably applied to a polishing composition comprising silica grains (typically consisting of silica grains) as the abrasive and intended for polishing silicon.

The shape of the polishing object is not particularly limited. The polishing composition disclosed herein can be preferably applied for polishing a polishing object having a flat surface such as a plate, polyhedron, etc.

The polishing composition disclosed herein can be preferably used for final polishing of a polishing object. Accordingly, this description provides a method for producing a polished polishing object (e.g. a method for producing a silicon wafer) comprising a final polishing step using the polishing composition. The final polishing refers to the last polishing step (i.e. a step after which no further polishing is performed) in a production process of a polishing object. The polishing composition disclosed herein may be used in an earlier polishing step than final polishing (referring to a preliminary polishing step between the rough polishing step and final polishing step, typically including at least a first polishing step and possibly second, third . . . polishing steps), for instance, in a polishing step performed before final polishing.

The polishing composition disclosed herein can be preferably used for polishing a silicon wafer. For instance, it is preferable as a polishing composition used in final polishing of a silicon wafer or in an earlier polishing step than this. For instance, it is effectively applied for polishing (typically final polishing or polishing just before this) of a silicon wafer prepared into a surface state having a surface roughness of 0.01 nm to 100 nm in an earlier step. It is particularly preferably applied to final polishing.

<Polishing Liquid>

The polishing composition disclosed herein is supplied to a polishing object, typically in a form of a polishing liquid comprising the polishing composition, and used for polishing the polishing object. The polishing liquid may be prepared, for instance, by diluting (typically with water) a polishing composition disclosed herein. Alternatively, the polishing composition can be used straight as a polishing liquid. In other words, the concept of polishing composition in the art disclosed herein encompasses both a polishing liquid (working slurry) supplied to a polishing object and used for polishing the polishing object and a concentrate (stock solution of polishing liquid) which is diluted for use as a polishing liquid. Other examples of the polishing liquid comprising the polishing composition disclosed herein include a polishing liquid obtained by adjusting the pH of the composition.

The water-soluble polymer content in the polishing liquid is not particularly limited. For instance, it can be $1 \times 10^{-4}\%$ by weight or higher. From the standpoint of haze reduction, etc., the polymer content is preferably $5 \times 10_{-4}\%$ by weight or greater, or more preferably $1 \times 10^{-3}\%$ by weight or greater, for instance, $2 \times 10^{-3}\%$ by weight or greater. From the standpoint of the polishing rate, etc., the polymer content is preferably 0.2% by weight or less, or more preferably 0.1% by weight or less (e.g. 0.05% by weight or less).

When the polishing composition comprises an abrasive, the abrasive content in the polishing liquid is not particularly limited. It is typically 0.01% by weight or higher, preferably 0.05% by weight or higher, or more preferably 0.1% by weight or higher, for instance, 0.15% by weight or higher. With increasing abrasive content, a higher polishing rate can be obtained. From the standpoint of obtaining a surface with lower haze, usually, the abrasive content is suitably 10% by weight or lower, preferably 7% by weight or lower, more preferably 5% by weight or lower, or yet more preferably 2% by weight or lower, for instance, 1% by weight or lower.

When the polishing liquid disclosed herein comprises a basic compound, the basic compound content in the polishing liquid is not particularly limited. From the standpoint of increasing the polishing rate, etc., usually, the basic compound content is preferably 0.001% by weight or more of the polishing liquid, or more preferably 0.003% by weight or more. From the standpoint of haze reduction, etc., the basic compound content is preferably below 0.4% by weight, or more preferably below 0.25% by weight.

The pH of the polishing liquid is not particularly limited. For instance, the pH is preferably 8.0 to 12.0, or more preferably 9.0 to 11.0. It is preferable that the basic compound is contained to yield such a pH of the polishing liquid. The pH can be preferably applied to a polishing liquid (e.g. polishing liquid for final polishing) used for polishing a silicon wafer.

When the polishing composition disclosed herein comprises a surfactant, the surfactant content in the polishing liquid is not particularly limited. For instance, it can be $1 \times 10^{-5}$% by weight or greater. From the standpoint of haze reduction, etc., a preferable surfactant content is $1 \times 10^{-4}$% by weight or greater, or more preferably $5 \times 10^{-4}$% by weight or greater, for instance, $1 \times 10^{-3}$% by weight or greater. From the standpoint of the washability, polishing rate, etc., the surfactant content is preferably 0.2% by weight or less, or more preferably 0.1% by weight or less (e.g. 0.05% by weight or less).

<Concentrate>

The polishing composition disclosed herein may be in a concentrated form (i.e. in a form of a concentrate of the polishing liquid) before supplied to a polishing object. The polishing composition in a concentrated form as this is advantageous from the standpoint of the convenience and cost reduction for production, distribution, storage, etc. The concentration can be, for instance, about 2-fold to 100-fold by volume while it is usually suitably about 5-fold to 50-fold. The concentration of the polishing composition according to a preferable embodiment is 10-fold to 40-fold, for instance, 15-fold to 25-fold.

The polishing composition in a concentrated form as this can be used in an embodiment where it is diluted whenever desired to prepare a polishing liquid and the polishing liquid is supplied to a polishing object. The dilution can be carried out typically by adding and mixing an aforementioned aqueous solvent with the concentrate. When the aqueous solvent is a solvent mixture, the dilution can be performed by adding just some of the components of the aqueous solvent or by adding a solvent mixture comprising the components at a mass ratio different from that of the aqueous solvent. With respect to a multi-pack polishing composition as described later, some of the packs may be diluted first and then mixed with other packs to prepare a polishing liquid, or the multiple packs may be mixed first followed by dilution of the mixture to prepare a polishing liquid.

The concentrate can have an NV of, for instance, 50% by weight or less. From the standpoint of the stability (e.g. dispersion stability of the abrasive) and ease of filtration of the polishing composition, etc., usually, the concentrate has an NV of suitably 40% by weight or less, preferably 30% by weight or less, or yet more preferably 20% by weight or less, for instance, 15% by weight or less. From the standpoint of the convenience and cost reduction for production, distribution, storage and so on, the NV of the concentrate is suitably 0.5% by weight or greater, preferably 1% by weight or greater, or more preferably 3% by weight or greater, for instance, 5% by weight or greater.

The water-soluble polymer content in the concentrate can be, for instance, 3% by weight or less. From the standpoint of the ease of filtration and washability of the polishing composition, etc., usually, the water-soluble polymer content is preferably 1% by weight or less, or more preferably 0.5% by weight or less. From the standpoint of the convenience and cost reduction for production, distribution, storage and so on, the water-soluble polymer content is usually suitably $1 \times 10^{-3}$ or greater, preferably $5 \times 10^{-3}$ or greater, or more preferably $1 \times 10^{-2}$ or greater.

When the polishing composition disclosed herein comprises an abrasive, the abrasive content in the concentrate can be, for instance, 50% by weight or less. From the standpoint of the stability (e.g. dispersion stability of the abrasive) and ease of filtration of the polishing composition, etc., usually, the abrasive content is preferably 45% by weight or less, or more preferably 40% by weight or less. In a preferable embodiment, the abrasive content can be 30% by weight or less, or even 20% by weight or less (e.g. 15% by weight or less). From the standpoint of the convenience and cost reduction for production, distribution, storage and so on, the abrasive content can be, for instance, 0.5% by weight or greater, preferably 1% by weight or greater, or more preferably 3% by weight or greater (e.g. 5% by weight or greater).

The polishing composition disclosed herein may be of a one-pack type or a multiple-pack type such as the two-pack type. For example, it may be formulated such that pack A that comprises some (e.g. polymer $M_{C\text{-}end}$) of the components of the polishing composition and pack B that comprises the rest (e.g. polymers $M_{A\text{-}end}$ and $M_{L\text{-}end}$) of the components are mixed and the mixture is used for polishing of a polishing object. Alternatively, it may also be used in an embodiment where to a polishing composition comprising a polymer $M_{C\text{-}end}$ and water, a separately obtained abrasive (e.g. silica grains) is mixed at a particular timing <Preparation of Polishing Composition>

The method for producing the polishing composition disclosed herein is not particularly limited. For instance, the respective components of the polishing composition can be mixed, using a commonly known mixing device such as a propeller stirrer, ultrasonic disperser, homo mixer, etc. The way of mixing these components is not particularly limited. For instance, all the components can be mixed at once or in a suitably selected order.

Although not particularly limited, with respect to a polishing composition comprising a basic compound, from the standpoint of consistently (reproducibly) producing polishing compositions having less aggregates, for instance, a production method that can be preferably employed comprises obtaining a dispersion comprising an abrasive (e.g. silica grains), a basic compound and water (or a "basic abrasive dispersion" hereinafter) and mixing the basic abrasive dispersion and a water-soluble polymer.

In such a basic abrasive dispersion containing both the abrasive and basic compound, the abrasive exhibits greater electrostatic repulsion due to the basic compound and thus shows higher dispersion stability than a basic compound-free abrasive dispersion (typically almost neutral). Accordingly, local aggregation of the abrasive is less likely to occur as compared with an embodiment where the basic compound is added after addition of the water-soluble polymer to a neutral abrasive dispersion and an embodiment where the neutral abrasive dispersion, water-soluble polymer and basic compound are mixed all at once. This is preferable from the standpoint of increasing the ease of filtration of the polishing composition or reducing defects in the polished surface, etc.

The water-soluble polymer is preferably pre-dissolved in water and mixed in the form of an aqueous solution (or "aqueous polymer solution" hereinafter) with the basic abrasive dispersion. This can better inhibit local aggregation of the abrasive.

When mixing the basic abrasive dispersion and aqueous polymer solution, it is preferable to add the aqueous polymer solution to the basic abrasive dispersion. According to such a mixing method, local aggregation of the abrasive can be better prevented, for instance, as compared with a mixing method where the basic abrasive dispersion is added to the aqueous polymer solution. When the abrasive is silica grains (e.g. colloidal silica grains), it is particularly meaningful to use the mixing method by which an aqueous polymer solution is added to a basic abrasive dispersion as described above.

Among the abrasive, water-soluble polymer, basic compound and water forming the polishing composition to be produced, the basic abrasive dispersion comprises at least some of the abrasive, at least some of the basic compound and at least some of the water. For instance, in a preferable embodiment, the abrasive dispersion comprises all the abrasive forming the polishing composition, at least some of the basic compound and at least some of the water.

The basic compound content in the basic abrasive dispersion is preferably 0.01% by weight or greater, more preferably 0.05% by weight or greater, or yet more preferably 0.1% by weight or greater. With increasing basic compound content, there is a tendency for greater inhibition of the occurrence of local aggregation during preparation of the polishing composition. The basic compound content in the basic abrasive dispersion is preferably 10% by weight or less, more preferably 5% by weight or less, or yet more preferably 3% by weight or less. A lower basic compound content facilitates adjustment of the basic compound content in the polishing composition.

The basic abrasive dispersion has a pH of preferably 8 or higher, or more preferably 9 or higher. With increasing pH, there is a tendency for greater inhibition of the occurrence of local aggregation when the water-soluble polymer or an aqueous solution thereof is added to the basic abrasive dispersion. The pH of the basic abrasive dispersion is preferably 12 or lower, more preferably 11.5 or lower, or yet more preferably 10.5 or lower. With the pH of the basic abrasive dispersion being lower in the basic side, the amount of the basic compound required for preparing the dispersion is reduced, making it easier to adjust the basic compound content in the polishing composition. For instance, when the abrasive is silica grains, it is also advantageous that the pH is not excessively high, from the standpoint of inhibiting dissolution of the silica. The mixture's pH can be adjusted by modifying the amount of the basic compound added, etc.

Such a basic abrasive dispersion can be prepared by mixing an abrasive, a basic compound and water. They can be mixed with a commonly known mixing device such as a propeller stirrer, ultrasonic disperser, homo mixer, etc. The mode of mixing the respective components of the basic abrasive dispersion is not particularly limited. For instance, the components can be mixed all at once or in a suitably selected order. An example of preferable embodiments is an embodiment where an approximately neutral dispersion comprising the abrasive and water is mixed with the basic compound or an aqueous solution thereof.

When mixing the water-soluble polymer in a form of an aqueous solution (aqueous polymer solution) into a basic abrasive dispersion, the water-soluble polymer content in the aqueous polymer solution is preferably 0.02% by weight or greater, more preferably 0.05% by weight or greater, or yet more preferably 0.1% by weight or greater. With increasing water-soluble polymer content, it becomes easier to adjust the water-soluble polymer content in the polishing composition. The water-soluble polymer content in the aqueous polymer solution is preferably 10% by weight or less, more preferably 5% by weight or less, or yet more preferably 3% by weight or less. With decreasing water-soluble polymer content, local aggregation of the abrasive tends to be more likely reduced when mixing the aqueous polymer solution with the basic abrasive dispersion.

The pH of the aqueous polymer solution is not particularly limited and can be adjusted, for instance, to pH 2 to 11. The pH of the aqueous polymer solution is adjusted preferably to almost neutral to near-basic, or more preferably to basic. More specifically, the pH of the aqueous polymer solution is preferably 8 or higher, or more preferably 9 or higher. The pH can be adjusted by using some of the basic compound forming the polishing composition. The increased pH of the aqueous polymer solution can more greatly reduce local aggregation of the abrasive when the aqueous polymer solution is added to the basic abrasive dispersion. The pH of the aqueous polymer solution is preferably 12 or lower, or more preferably 10.5 or lower. With decreasing pH of the aqueous polymer solution in the basic side, the amount of the basic compound required for preparing the aqueous polymer solution is reduced, making it easier to adjust the basic compound content in the polishing composition. For instance, when the abrasive is silica grains, it is advantageous that the pH is not excessively high also from the standpoint of inhibiting dissolution of the silica.

The rate (supply rate) of adding the aqueous polymer solution to the basic abrasive dispersion is preferably, with respect to 1 L of the dispersion, at or below 500 mL of aqueous polymer solution per minute, more preferably at or below 100 mL/min, or yet more preferably at or below 50 mL/min. With decreasing supply rate, local aggregation of the abrasive can be more greatly reduced.

In a preferable embodiment, the aqueous polymer solution can be filtered before added to the basic abrasive dispersion. By filtering the aqueous polymer solution, the amounts of contaminants and aggregates in the aqueous polymer solution can be further reduced.

The filtration method is not particularly limited. Known filtration methods can be suitably employed such as natural filtration performed at room pressure as well as suction filtration, pressure filtration, centrifugal filtration, etc. The filter used for filtration is preferably selected based on mesh size. From the standpoint of the productivity of polishing compositions, the filter's mesh size is preferably 0.05 µm or larger, more preferably 0.1 µm or larger, or yet more preferably 0.2 µm or larger. From the standpoint of increasing the effect of eliminating contaminants and aggregates, the filter's mesh size is preferably 100 µm or smaller, more preferably 70 µm or smaller, or yet more preferably 50 µm or smaller. The filter's material or construction is not particularly limited. Examples of the filter's material include cellulose, nylon, polysulfone, polyether sulfone, polypropylene, polytetrafluoroethylene (PTFE), polycarbonate, glass, etc. Examples of the filter's construction include depth, pleated, membrane, etc.

The polishing composition production method described above can be preferably applied when the polishing composition obtainable by mixing the basic abrasive dispersion and the water-soluble polymer or an aqueous solution thereof is a polishing liquid (working slurry) or has approximately the same NV as this as well as when it is a concentrate described later.

<Polishing>

The polishing composition disclosed herein can be used for polishing a polishing object, for instance, in an embodiment comprising the following operations. Described below is a preferable embodiment of the method for polishing a polishing object using the polishing composition disclosed herein.

In particular, a polishing liquid (which is typically a slurry polishing liquid and sometimes called a polishing slurry) is obtained, comprising a polishing composition disclosed herein. The obtaining of the polishing liquid may include preparing the polishing liquid by subjecting the polishing composition to operations such as concentration adjustment (e.g. dilution), pH adjustment, etc. Alternatively, the polishing composition can be used straight as the polishing liquid. As for a multi-pack polishing composition, the obtaining of the polishing liquid may include mixing the packs, diluting a certain phase or multiple phases prior to the mixing, diluting the mixture after the mixing, and so on.

Subsequently, the polishing slurry is supplied to a polishing object and polishing is carried out by a conventional method. For instance, when carrying out final polishing of a silicon wafer, the silicon wafer after a lapping step and first polishing step is set in a general polishing machine and via a polishing pad in the polishing machine, the polishing slurry is supplied to the surface (surface to be polished) of the silicon wafer. Typically, while the polishing slurry is continuously supplied, the polishing pad is pushed against the surface of the silicon wafer, and the two are moved (e.g. moved in circular motion) in coordination. Via such a polishing step, polishing of the polishing object is completed.

The polishing pad(s) used in the polishing step are not particularly limited. For instance, any of the non-woven fabric type, suede type, abrasive-bearing type, abrasive-free type, etc., can be used.

<Rinse>

A polished object polished with the polishing composition disclosed herein comprising an abrasive may be rinsed with a rinse solution comprising the same components as the polishing composition but without the abrasive. In other words, the art disclosed herein may have a step (rinsing step) of rinsing the polished object with a rinse solution that comprises the same components as the polishing composition but without the abrasive. The rinsing step can reduce residues of the abrasive and the like that cause defects in the polished object's surface. The rinsing step may be performed between a polishing step and another polishing step or after final polishing but before the cleaning step described later. By rinsing it with the rinse solution comprising the same components as the polishing composition but without the abrasive, defects and haze can be further reduced, without hindering the effect of, for instance, the water-soluble polymer (e.g. polymer $M_{C\text{-}end}$) attracted on the surface of the polishing object (e.g. a silicon wafer). Such a rinse solution may typically be a silicon wafer polishing composition that comprises a water-soluble polymer (e.g. polymer $M_{C\text{-}end}$) and water (in particular, a composition used for rinsing in the polishing of silicon wafers, also called a rinse composition). The composition, etc., of the rinse composition is basically the same as the polishing composition described above except for the absence of the abrasive. Thus, the description is not repeated here.

<Cleaning>

The polishing object polished with the polishing composition disclosed herein is typically cleaned after polished (after rinsed if necessary). The cleaning can be carried out, using a suitable cleaning solution. The cleaning solution used is not particularly limited. Usable examples include SC-1 cleaning solution (a mixture of ammonium hydroxide ($NH_4OH$), hydrogen peroxide ($H_2O_2$) and water ($H_2O$); cleaning with SC-1 cleaning solution is referred to as "SC-1 cleaning" hereinafter), SC-2 cleaning solution (a mixture of HCl, $H_2O_2$ and $H_2O$) and the like generally used in the field of semiconductors. The temperature of the cleaning solution can be, for instance, normal temperature to about 90° C. From the standpoint of increasing the cleaning efficiency, a cleaning solution at about 50° C. to 85° C. can be preferably used.

Several working examples relating to the present invention are described below although the present invention is not to be limited to such working examples. In the description below, "parts" and "%" are by weight unless otherwise specified.

<Preparation of Polishing Compositions>

EXAMPLE 1

Were mixed an abrasive, a water-soluble polymer, ammonia water (29% concentration) and deionized water to obtain a polishing composition concentrate. The concentrate was diluted by a factor of 20 with deionized water.

As the abrasive, was used a colloidal silica of 35 nm average primary particle diameter and 66 nm average secondary particle diameter. The average primary particle diameter was measured with a surface area analyzer under trade name "FLOW SORB II 2300" available from Micromeritics. The average secondary particle diameter was the volume average secondary particle diameter measured with a model "UPA-UT151" available from Nikkiso Co., Ltd.

As the water-soluble polymer, was used a polyvinyl alcohol (PVA-A) prepared, using an azo-based initiator V-50 (available from Wako Pure Chemical Industries, Ltd.) as the polymerization initiator. PVA-A had a degree of saponification of at least 98%.

The abrasive, water-soluble polymer and ammonia water were used in amounts to yield 0.46% abrasive content, 0.018% water-soluble polymer content and 0.01% ammonia (NH3). This polishing composition had a pH of 10.2.

EXAMPLE 2

As the water-soluble polymer, a polyvinyl alcohol (PVA-B) and another polyvinyl alcohol (PVA-C) were used at a ratio of 1:1. Otherwise, in the same manner as Example 1, a polishing composition according to Example 2 was prepared. PVA-B is a polyvinyl alcohol prepared, using an azo-based initiator V-50 (available from Wako Pure Chemical Industries, Ltd.) as the polymerization initiator. PVA-C is a polyvinyl alcohol prepared, using an azo-based initiator AIBN (available from Otsuka Chemical Co., Ltd.) as the polymerization initiator. PVA-B and PVA-C had each a degree of saponification of at least 98%. This polishing composition had a pH of 10.2.

EXAMPLE 3

As the water-soluble polymer, PVA-A and another polyvinyl alcohol (PVA-D) were used at a ratio of 1:1. Otherwise, in the same manner as Example 1, a polishing composition according to Example 3 was prepared. PVA-D is a polyvinyl alcohol prepared, using an azo-based initiator ACVA (available from Otsuka Chemical Co., Ltd.) as the polymerization initiator. PVA-D had a degree of saponification of at least 98%. This polishing composition had a pH of 10.2.

EXAMPLE 4

As the water-soluble polymer, a polyacryloylmorpholine (PACMO-A) and a polyvinyl alcohol (PVA-E) were used at a ratio of 2:1. The water-soluble polymers were used in amounts to yield 0.015% water-soluble polymer content in the polishing composition. Otherwise, in the same manner as Example 1, a polishing composition according to Example 4 was prepared. PACMO-A is a polyacryloylmorpholine prepared, using an azo-based initiator V-50 (available from Wako Pure Chemical Industries, Ltd.) as the polymerization initiator. PVA-E is a polyvinyl alcohol prepared, using an azo-based initiator AIBN (available from Otsuka Chemical Co., Ltd.) as the polymerization initiator. PVA-E had a degree of saponification of at least 98%. This polishing composition had a pH of 10.2.

EXAMPLE 5

As the water-soluble polymer, a polyacryloylmorpholine (PACMO-B) and PVA-E were used at a ratio of 2:1. Otherwise, in the same manner as Example 4, a polishing composition according to Example 5 was prepared. PACMO-B is a polyacryloylmorpholine polymerized using an azo-based initiator V-50 (available from Wako Pure Chemical Industries, Ltd.) as the polymerization initiator. This polishing composition had a pH of 10.2.

COMPARATIVE EXAMPLES 1-3

As the water-soluble polymer, in place of PVA-A, were used PVA-C (Comparative Example 1), PVA-D (Comparative Example 2) and a cation-modified PVA (Comparative Example 3). Otherwise, in the same manner as Example 1, polishing compositions according to Comparative Examples 1 to 3 were prepared. The cation-modified PVA is a random copolymer of a cationic group-containing monomer and a VA obtained by polymerization using an azo-based initiator V-50 (available from Wako Pure Chemical Industries, Ltd.) as the polymerization initiator. The molar ratio (ratio in number of moles) of VA to cationic group-containing monomer was 79:21.

Table 1 summarizes the water-soluble polymers used in Examples and Comparative Examples.

<Silicon Wafer Polishing>

Using the polishing compositions according to the respective examples as they were as polishing liquids, silicon wafer surfaces were polished under the conditions shown below. As the silicon wafers, were used rough-polished pieces of 300 mm diameter, p-type conductivity, crystal orientation of <100> and a resistivity of 0.1 Ωcm or greater, but less than 100 Ωcm that had been preliminarily polished with a polishing slurry (trade name "GLANZOX 2100" available from Fujimi, Inc.) to a surface roughness of 0.1 nm to 10 nm.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out. (The conditions below were common between the two tables)

Polishing pressure: 15 kPa

Plate rotational speed: 30 rpm

Head rotational speed: 30 rpm

Polishing time 2 min

Temperature of polishing liquid: 20 °C.

Flow rate of polishing liquid: 2.0 L/min (drain)

<Cleaning>

Polished silicon wafers were cleaned (SC-1 cleaning) with a cleaning solution at NH4OH (29%)/H$_2$O$_2$ (31%)/deionized water (DIW)=1/3/30 (volume ratio). More specifically, two cleaning baths each attached with an ultrasonic wave oscillator of 950 kHz frequency were obtained; the cleaning solution was placed in each of the first and second cleaning baths and maintained at 60° C.; and each polished silicon wafer was immersed in the first cleaning bath for 6 minutes and then, via a ultrasonic rinsing bath with ultrapure water, in the second cleaning bath for 6 minutes, with the respective ultrasonic wave oscillators turned on.

<Measurement of Polishing Rate>

Silicon wafers were weighed before polishing and after cleaning. Based on their differences, the polishing rates (nm/min) were determined. Table 1 shows the results as relative values, with the polishing rate of Comparative Example 1 being 100%.

<Scratch Analysis>

Using a wafer inspection system under trade name "SURFSCAN SP2" available from KLA-Tencor Corporation, the cleaned surfaces of silicon wafers were measured for the number of scratches in Oblique mode. Table 1 shows the results as relative values, with the number of scratches of Comparative Example 1 being 100%.

TABLE 1

|  | Water-soluble polymer | | | Polishing | |
|---|---|---|---|---|---|
|  | Species | Terminal property | Mw | Concentration (wt %) | rate (%) | Scratch (%) |
| Ex. 1 | PVA-A | Cationic | 25,000 | 0.018 | 120 | 90 |
| Ex. 2 | PVA-B | Cationic | 10,000 | 0.009 | 110 | 60 |
|  | PVA-C | Hydrophobic | 25,000 | 0.009 | | |

TABLE 1-continued

|  | Water-soluble polymer | | | | Polishing | |
|---|---|---|---|---|---|---|
|  | Species | Terminal property | Mw | Concentration (wt %) | rate (%) | Scratch (%) |
| Ex. 3 | PVA-A | Cationic | 25,000 | 0.009 | 115 | 70 |
|  | PVA-D | Anionic | 45,000 | 0.009 | | |
| Ex. 4 | PACMO-A | Cationic | 330,000 | 0.01 | 110 | 50 |
|  | PVA-E | Hydrophobic | 15,000 | 0.005 | | |
| Ex. 5 | PACMO-B | Cationic | 650,000 | 0.01 | 115 | 40 |
|  | PVA-E | Hydrophobic | 15,000 | 0.005 | | |
| Comp. Ex. 1 | PVA-C | Hydrophobic | 25,000 | 0.018 | 100 | 100 |
| Comp. Ex. 2 | PVA-D | Anionic | 45,000 | 0.018 | 105 | 150 |
| Comp. Ex. 3 | Cation-modified PVA | Cationic | 25,000 | 0.018 | 120 | 200 |

As shown in Table 1, Examples 1 to 3 which used polishing compositions each comprising, as the water-soluble polymer, PVA-A (polymer $M_{C\text{-}end}$) or PVA-B (polymer $M_{C\text{-}end}$) having a cationic region at one end of the main chain (more specifically, a cationic group at one terminus of the main chain) achieved excellent polishing rates and were superior in reducing scratches as compared to Comparative Examples 1 and 2 using no polymer $M_{C\text{-}end}$ as the water-soluble polymer. Examples 4 and 5 which used polishing compositions each comprising, as the water-soluble polymer, PACMO-A (polymer $M_{C\text{-}end}$) or PACMO-B (polymer $M_{C\text{-}end}$) having a cationic region at one end of the main chain (more specifically, a cationic group at one terminus of the main chain) achieved excellent polishing rates and were superior in reducing scratches as compared to Comparative Examples 1 and 2 not using any $M_{C\text{-}end}$ as the water-soluble polymer. On the other hand, a significantly larger number of scratches were observed in Comparative Example 3 using the cation-modified PVA with cationic groups being randomly present in the main chain. From these results, it is evident that the polymer $M_{C\text{-}end}$ efficiently reduced surface defects by having the cationic region at one end of the main chain, but not randomly. It is presumed that this effect is brought about by the polymer $M_{C\text{-}end}$ being attracted only at the end to the abrasive.

In Example 2 using the polishing composition that comprised PVA-B (polymer $M_{C\text{-}end}$) as well as PVA-C (polymer $M_{L\text{-}end}$) having a hydrophobic region at one end of the main chain (more specifically a hydrophobic group at one terminus of the main chain), there were even a smaller number of scratches as compared to Example 1 using solely PVA-A. From this result, it is presumed that the polymer $M_{L\text{-}end}$ contributed to reduction of scratches by a different mechanism from that of the polymer $M_{C\text{-}end}$. In particular, the polymer $M_{L\text{-}end}$ is considered to have contributed to reduction of scratches by being attracted well to the surface of the polishing object (silicon wafer).

In Example 3 using the polishing composition that comprised PVA-A (polymer $M_{C\text{-}end}$) as well as PVA-D (polymer $M_{A\text{-}end}$) having an anionic region at one end of the main chain (more specifically an anionic group at one terminus of the main chain), a yet smaller number of scratches were observed as compared with Example 1 using solely PVA-A. From this result, it is presumed that the polymer $M_{A\text{-}end}$ contributed to reduction of surface defects by a different mechanism from that of the polymer $M_{C\text{-}end}$.

Example 4 using the polishing composition that comprised PACMO-A (polymer $M_{C\text{-}end}$) as well as PVA-E (polymer $M_{L\text{-}end}$) having a hydrophobic region at one end of the main chain (more specifically a hydrophobic group at one terminus of the main chain) maintained an equally excellent polishing rate and were even more superior in reducing scratches as compared to Example 2 using PVA-B (polymer $M_{C\text{-}end}$) and PVA-C (polymer $M_{L\text{-}end}$) together. Example 5 using PACMO-B (polymer $M_{C\text{-}end}$) having a larger molecular weight in place of PACMO-A (polymer $M_{C\text{-}end}$) used in Example 4 exhibited a higher polishing rate and yet more superior scratch-reducing nature as compared to Example 4.

Although specific embodiments of the present invention have been described in detail above, these are merely for illustrations and do not limit the scope of claims. The art according to the scope of claims includes various modifications and changes made to the specific embodiments illustrated above.

The invention claimed is:

1. A polishing composition comprising a water-soluble polymer $M_{C\text{-}end}$,
    the water-soluble polymer $M_{C\text{-}end}$ having a main chain formed with a non-cationic region as its main structural part and a cationic region located at least at one end of the main chain,
    the cationic region having at least one cationic group,
    the water-soluble polymer $M_{C\text{-}end}$ consisting of the non-cationic region and the cationic region located at a terminus of the main chain, and
    the non-cationic region is a vinyl alcohol-based region or an acryloylmorpholine-based region.

2. The polishing composition according to claim 1, wherein the cationic region is present only at the one end of the main chain.

3. The polishing composition according to claim 1, wherein the main chain is formed with carbon-carbon bonds.

4. The polishing composition according to claim 1 having a pH in a range of 8 to 12.

5. The polishing composition according to claim 1, wherein the water-soluble polymer $M_{C\text{-}end}$ is a vinyl alcohol-based polymer.

6. The polishing composition according to claim 1, wherein the cationic group is an amino group.

7. The polishing composition according to claim 1, wherein the cationic group is present at a terminus of the main chain.

8. The polishing composition according to claim 1 further comprising a water-soluble polymer $M_{A\text{-}end}$ in addition to the water-soluble polymer $M_{C\text{-}end}$,
    the water-soluble polymer $M_{A\text{-}end}$ having a main chain formed with a non-anionic region as its main structural part and an anionic region located at least at one end of the main chain, and
    the anionic region having at least one anionic group.

9. A polishing composition comprising a water-soluble polymer $M_{C\text{-}end}$,
  the water-soluble polymer $M_{C\text{-}end}$ having a main chain formed with a non-cationic region as its main structural part and a cationic region located at least at one end of the main chain,
  the cationic region having at least one cationic group,
  the polishing composition further comprising a water-soluble polymer $M_{L\text{-}end}$ in addition to the water-soluble polymer $M_{C\text{-}end}$,
  the water-soluble polymer $M_{L\text{-}end}$ having a main chain formed with a hydrophobic region at least at one end of the main chain, and
  the hydrophobic region having at least one hydrophobic group derived from a polymerization initiator.

10. The polishing composition according to claim 1 further comprising an abrasive.

11. The polishing composition according to claim 1 used for polishing a silicon wafer.

12. A method for producing a polishing composition, the method characterized by preparing a polishing composition comprising a water-soluble polymer $M_{C\text{-}end}$ having a main chain formed with a non-cationic region and a cationic region, the cationic region being located at least at one end of the main chain and having at least one cationic group,
  wherein the water-soluble polymer $M_{C\text{-}end}$ consists of the non-cationic region and the cationic region located at a terminus of the main chain, and
  the non-cationic region is a vinyl alcohol-based region or an acryloylmorpholine-based region.

13. The polishing composition according to claim 1, wherein the non-cationic region is a non-ionic region.

14. The method according to claim 12, wherein the non-cationic region is a non-ionic region.

15. The polishing composition according to claim 9, wherein the cationic region of the water-soluble polymer $M_{C\text{-}end}$ is present only at the one end of the main chain.

16. The polishing composition according to claim 9, wherein the main chain of the water-soluble polymer $M_{C\text{-}end}$ is formed with carbon-carbon bonds.

17. The polishing composition according to claim 9 having a pH in a range of 8 to 12.

18. The polishing composition according to claim 9, wherein the water-soluble polymer $M_{C\text{-}end}$ is a vinyl alcohol-based polymer.

19. The polishing composition according to claim 9, wherein the cationic group of the water-soluble polymer $M_{C\text{-}end}$ is an amino group.

20. The polishing composition according to claim 9, wherein the cationic group of the water-soluble polymer $M_{C\text{-}end}$ is present at a terminus of the main chain.

* * * * *